United States Patent [19]
Matsuyama

[11] Patent Number: 5,282,902
[45] Date of Patent: Feb. 1, 1994

[54] SOLAR CELL PROVIDED WITH A LIGHT REFLECTION LAYER

[75] Inventor: Jinsho Matsuyama, Nagahama, Japan

[73] Assignee: Canon Kabushiki Kaisha, Tokyo, Japan

[21] Appl. No.: 880,521

[22] Filed: May 8, 1992

[30] Foreign Application Priority Data

May 9, 1991 [JP] Japan .................. 3-132264

[51] Int. Cl.$^5$ .................. H01L 31/052; H01L 31/04
[52] U.S. Cl. .................. 136/249; 136/256; 136/258; 136/259; 257/436; 257/458
[58] Field of Search .......... 136/249 TJ, 265, 258 AM, 136/259; 257/436, 458

[56] References Cited

U.S. PATENT DOCUMENTS

| | | | |
|---|---|---|---|
| 4,126,150 | 11/1978 | Bell et al. .................. | 136/255 |
| 4,252,865 | 2/1981 | Gilbert et al. .................. | 428/611 |
| 4,497,974 | 2/1985 | Deckman et al. .................. | 136/259 |
| 5,136,351 | 8/1992 | Inoue et al. .................. | 257/436 |

FOREIGN PATENT DOCUMENTS

| | | | |
|---|---|---|---|
| 55-108780 | 8/1980 | Japan .................. | 136/259 |
| 56-69875 | 6/1981 | Japan .................. | 136/256 |
| 56-152276 | 11/1981 | Japan .................. | 136/258 AM |
| 58-159383 | 9/1983 | Japan .................. | 136/259 |
| 58-180069 | 10/1983 | Japan .................. | 136/244 |
| 59-14682 | 1/1984 | Japan .................. | 136/259 |
| 59-82778 | 5/1984 | Japan .................. | 136/259 |
| 59-213174 | 12/1984 | Japan .................. | 136/256 |
| 60-257183 | 12/1985 | Japan .................. | 136/259 |

*Primary Examiner*—Aaron Weisstuch
*Attorney, Agent, or Firm*—Fitzpatrick, Cella, Harper & Scinto

[57] ABSTRACT

A solar cell comprising a substrate having a surface, a first conductive layer disposed on the surface of said substrate, said first conductive layer having a roughened surface provided with irregularities at the surface thereof, a second conductive layer disposed on the roughened surface of said first conductive layer, said second conductive layer having a roughened surface provided with irregularities, a semiconductor active layer disposed on the roughened surface of said second conductive layer and an upper conductive layer disposed on said semiconductor active layer, wherein said second conductive layer is formed of a 10 nm to 150 nm thick highly reflective metal film. The solar cell exhibits an improved photoelectric conversion efficiency and can be mass-produced at an improved yield.

14 Claims, 14 Drawing Sheets

MAXIMUM DIFFERENCE OF ELEVATION(Rmax)

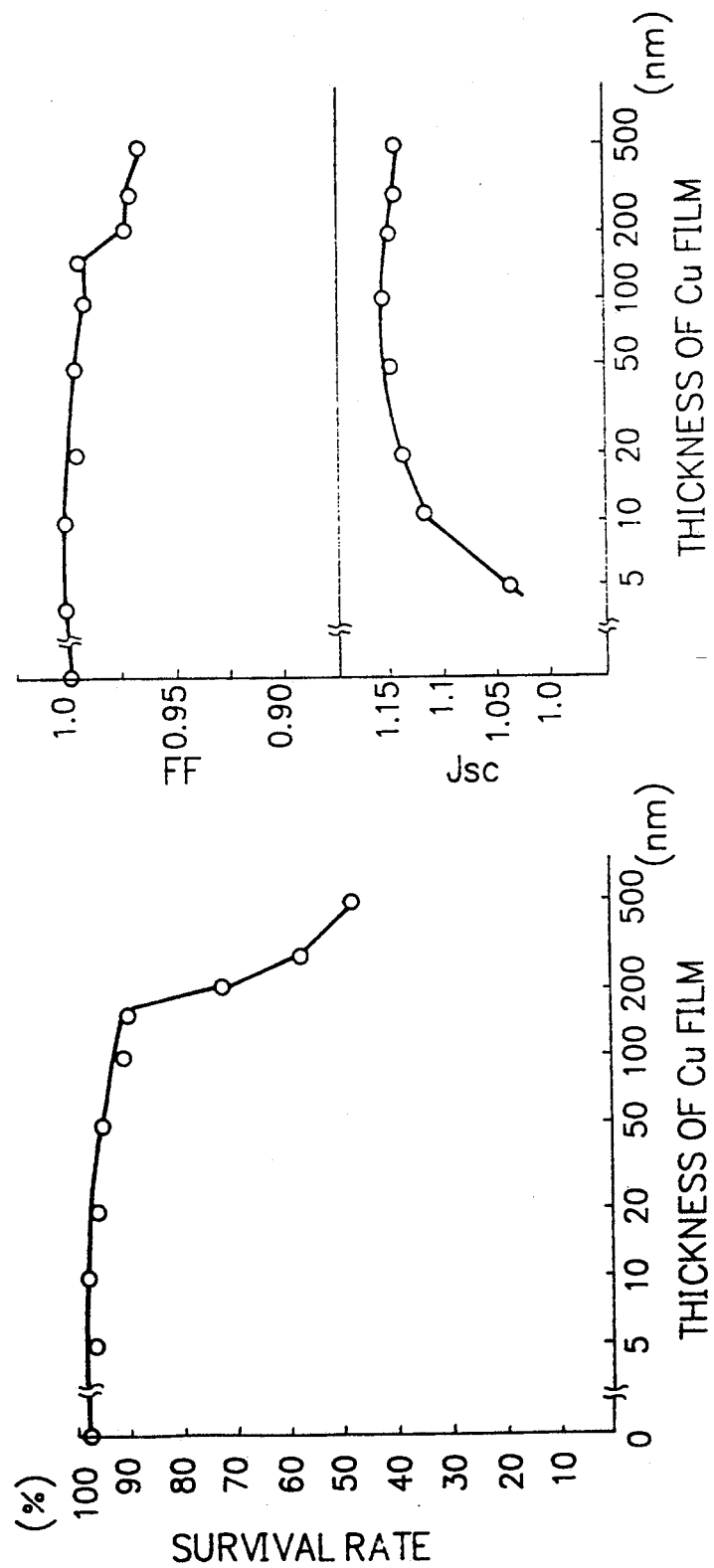

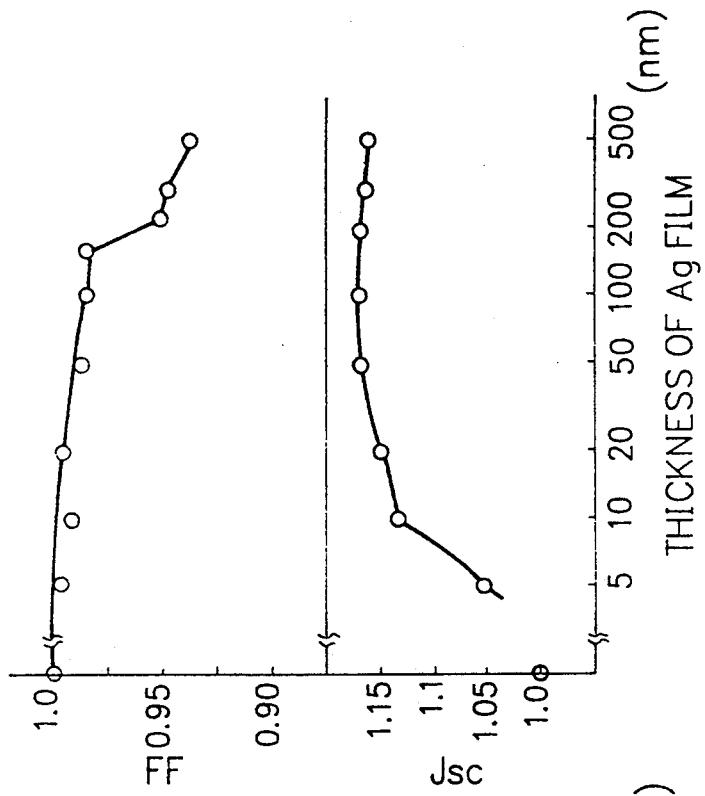
F I G. 9(A)
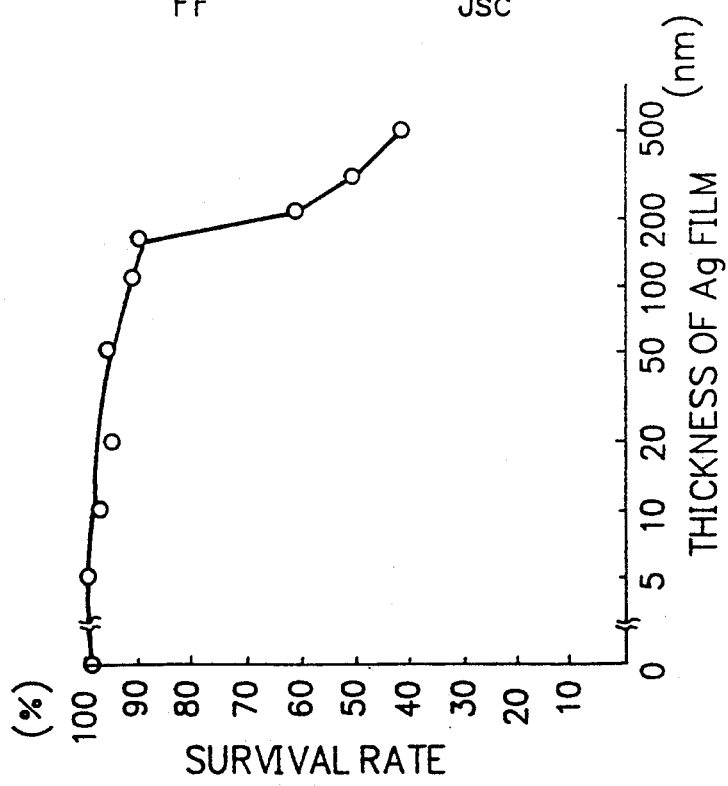
F I G. 9(B)

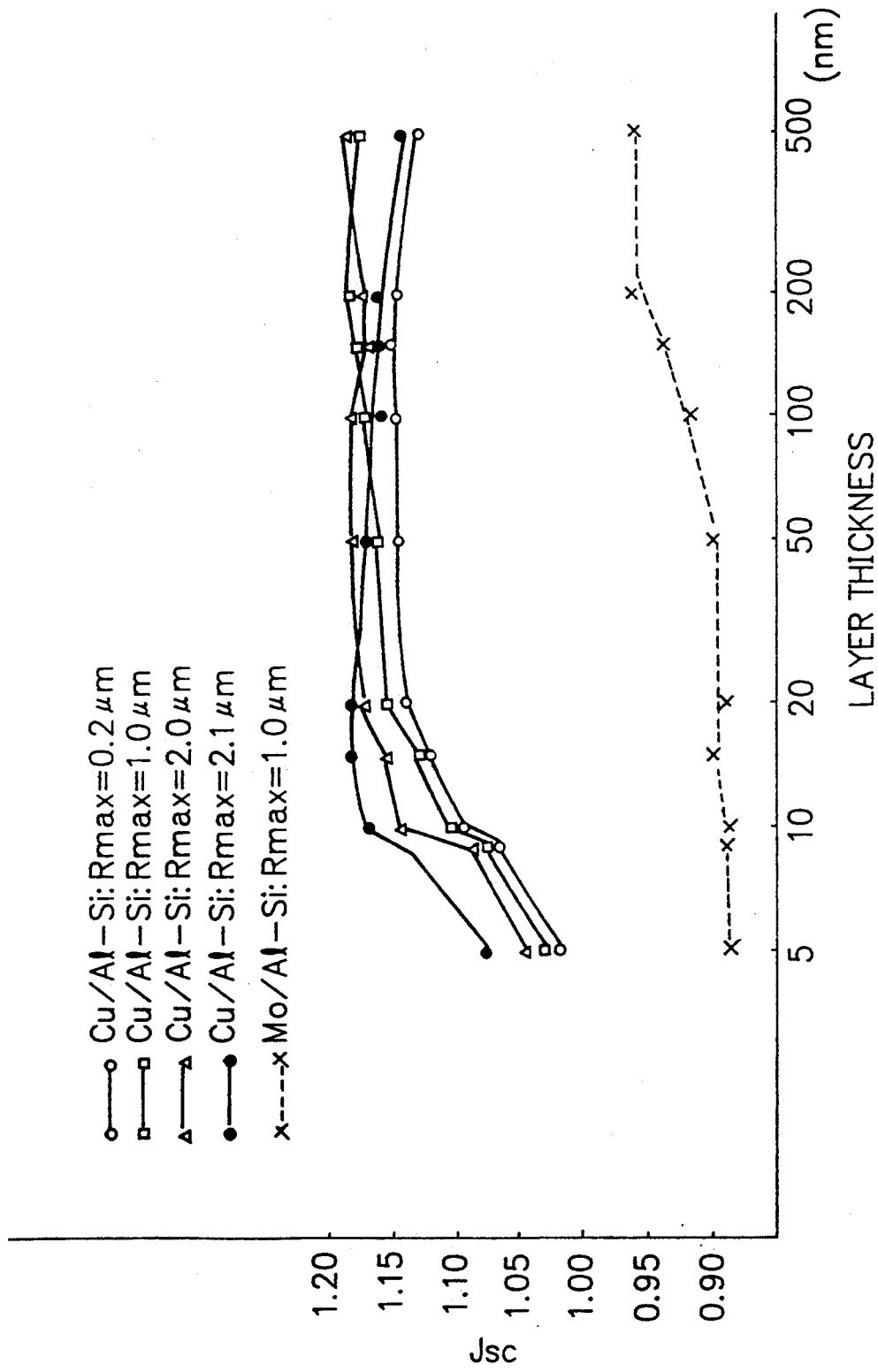

SOLAR CELL PROVIDED WITH A LIGHT REFLECTION LAYER

BACKGROUND OF THE INVENTION

1. Field of the Invention

The present invention relates to a solar cell provided with an improved light reflection layer. More particularly, the present invention relates to a solar cell provided with an improved light reflection layer capable of improving the quantity of light absorbed by the semiconductor active layer, which exhibits an improved photoelectric conversion efficiency and which can be provided at a reduced cost.

2. Related Background Art

In recent years, there has been an increased societal demand for early realization of a power generation system capable of providing clean energy without causing $CO_2$ buildup as in the case of thermal power generation.

There have been various proposals to meet such societal demands. Of those proposals, solar cells are expected to be a future power generation source since they supply electric power without causing problems such as above mentioned.

There are presently a variety of solar cells which have been put into practical use. These solar cells can be categorized roughly into cells made of a single crystal material (which is commonly called "single crystal solar cell"); solar cells made of a polycrystalline material (which is commonly called "polycrystalline solar cell"); solar cells made of an amorphous material (which is commonly called "amorphous solar cell"); and solar cells made of a compound semiconductor material (which is commonly called "compound solar cell").

In order to make a solar cell which is usable as a daily power source, it is essential that large area solar cells can be industrially mass produced at low cost. This requirement is hardly accomplished by either the single crystal solar cells or the polycrystal solar cells. In view of this, amorphous solar cells and compound solar cells have been spotlighted since they can relatively easily be made in a large area and industrially mass produced at a low cost. Various studies have been made of these amorphous and compound solar cells, especially in terms of their production cost and improvement in their photoelectric conversion efficiency.

In any case, one of the most important factors for these solar cells to be usable as a daily power source is that they stably provide a desirable photoelectric conversion efficiency. For this purpose, there have been proposed a number of semiconductor films as the semiconductor active layer which serves to absorb incident light and generate photocarriers causing a photoelectromotive force. In addition, various techniques have been proposed in order to improve their photoelectric conversion efficiency. As one such technique, it is known to dispose a reflection layer comprised of a film of a metal with a high reflectivity such as Ag, Al, Cu, and Au at the side of the solar cell which is opposite the side through which light is impinged. This technique is aimed at improving the photoelectric conversion efficiency by reflecting light which has passed through the semiconductor active layer without being absorbed back into the semiconductor active layer, whereby the output current is increased. Also, there are known a number of other techniques for improving the photoelectric conversion efficiency of a solar cell. For example, U.S. Pat. No. 4,126,150 and Japanese Laid-open patent application 56(1981)- 152276 describe a method of improving the power output of a solar cell provided with a light reflective substrate by using a light reflective member having a roughened surface provided with irregularities as the light reflective substrate to reflect and scatter light which has passed through the semiconductor active layer, thereby increasing the optical path of long wavelength light with a small absorption coefficient. Similarly, U.S. Pat. No. 4,497,974 describes an optically enhanced solar cell provided with a substrate having a surface textured by using a lithographic technique.

Thomas C. Paulick, *Journal of Applied Physics*, Vol. 62(7), pp. 3016–3024 (Oct. 1, 1987) reports observations of optically reflective characteristics of amorphous silicon solar cells with a textured interface.

As for the method of forming irregularities at the surface of a substrate to be used in a solar cell, there have been various proposals. For example, U.S. Pat. No. 4,252,865 describes a wet-etching method; Japanese Laid-open patent applications 58(1983)-159383 and 59(1984)-82778 describe a sputter etching method and a sand blasting method; and Japanese Laid-open patent application 59(1984)-14682 describes a method of roughening the surface of an aluminum substrate by means of direct current electrolytic etching or chemical etching.

As for the material to be treated to provided a roughened surface, there are various proposals. For example, Japanese Laid-open patent application 58(1983)-180069 describes the use of an organic insulating layer and a metal reflective layer disposed on said organic insulating layer which can be easily treated to provide a roughened surface; and Japanese Laid-open patent application 59(1984)-213174 describes use of a ceramic substrate.

In addition to those above mentioned, Japanese Laid-open patent publication 55(1980)-108780 describes interposition of a transparent and conductive layer between the back electrode and the thin film solar cell semiconductor substrate in order to obtain a high reflectivity back electrode. Similarly, Japanese Laid-open patent application 56(1981)-69875 describes interposition of a transparent and conductive layer between the amorphous semiconductor layer and the conductive substrate in order to relax the conditions required for the mirror state of the substrate surface.

SUMMARY OF THE INVENTION

The present inventor has made studies of solar cells with the known reflection members with a roughened surface provided with irregularities, in terms of effective utilization of long wavelength light by way of light confinement in order to improve the photoelectric conversion efficiency of such solar cells. As a result, the following has been found. That is, the greater the maximum difference of elevation (peak to valley) (Rmax) of the irregularities formed at the surface of the reflection member, the greater the utilization effect of long wavelength light, but in the case where the irregularities of the reflection member are formed of a film of a highly reflective material such as Al or Al-Si, shunt portions are often liable to occur between opposite electrodes, resulting in reducing the photoelectric conversion efficiency; and in the case where the irregularities of the reflection member are formed of a film of a metal having a high melting point such as Cr, Ti, Mo, or W, the probability of occurrence of short-circuited portions between opposite electrodes is small but sufficient light reflection is hardly attained, whereby a satisfactory photoelectric conversion efficiency is not provided.

The present invention is aimed at overcoming the above problems in the prior art and providing an improved solar cell which provides a high photoelectric conversion efficiency.

Another object of the present invention is to provide an improved solar cell which can be mass-produced at a high yield.

A further object of the present invention is to provide an improved solar cell of such a configuration that causes sufficient light reflection and exhibits desirable light scattering characteristics to thereby provide an improved photoelectric conversion efficiency.

A still further object of the present invention is to provide an improved solar cell comprising a substrate having thereon a layer with an uneven surface provided with irregularities and composed of a metallic material, a first conductive layer disposed on the uneven surface of said layer, said first conductive layer having an uneven surface provided with irregularities, a semiconductor active layer disposed on the uneven surface of said conductive layer and a second conductive layer imposed on said semiconductor active layer, wherein said first conductive layer comprises a highly reflective metal film of a thickness in the range of from 10 nm and 150 nm.

The present invention has been accomplished on the basis of the following obtained as a result of the experiments by the present inventor in order to overcome the foregoing problems in the prior art and to attain the above objects.

The results of the experiments can be summarized as follows.

That is, (i) in the case where the reflection layer of a solar cell is formed of a film of a metal having a high reflectivity such as Ag, Cu, or Au, when said metal film is controlled to be of a thickness less than a certain value, diffusion of the constituent metal of the reflection layer into the semiconductor active layer is markedly diminished; (ii) in order for the reflection layer to exhibit satisfactory light scattering characteristics, the reflection layer is required to have irregularities with a predetermined difference of elevation at the surface thereof; and (iii) in order to form such irregularities with a predetermined difference of elevation at the surface of the reflection layer, the reflection layer comprised of said metal film is required to have a thickness greater than the value mentioned in (i) above.

Experiments 1 to 4 will now be described in the following.

EXPERIMENT 1

Experiment 1-1

There were provided a plurality of stainless steel plates having a flat surface provided with irregularities of less than 0.05 μm in maximum difference of elevation (peak to valley) (Rmax) as the substrate.

On each of the stainless steel substrates there was deposited a Cu film of a different thickness in the range of from 5 nm to 500 nm by means of a conventional sputtering method, wherein a Cu target was sputtered while maintaining the stainless steel substrate at a temperature of about 350° C.

Thus, there were obtained a plurality of base member samples each comprising a stainless steel plate having a flat surface of less than 0.05 μm in maximum difference of elevation (Rmax) and a Cu film of a different thickness in the range of from 5 nm to 500 nm disposed on said stainless steel plate.

On the Cu film of each of said plurality of base member samples there was then formed a pin junction semiconductor layer comprising an n-type amorphous silicon film (n-type a-Si film), an i-type amorphous silicon-germanium film (i-type a-SiGe film), and a p-type microcrystalline silicon film successively laminated from the side of the substrate by means of a conventional plasma CVD method, wherein said i-type a-SiGe film was made to have a thickness of 250 nm.

Next, there was formed a 70 nm thick ITO film on the pin junction semiconductor layer by means of a conventional evaporation method. Finally, on the ITO film there was formed a collecting electrode comprising an Al film by means of a conventional evaporation method. Thus, there were obtained a plurality of single pin junction a-SiGe solar cell samples (A) each being different in the thickness of the Cu film disposed on the stainless steel plate. The i-type a-SiGe film of each of the resultant a-SiGe solar cell samples (A) was found to have an optical band gap (Eg) of 1.48 eV.

Each of the resultant a-SiGe solar cell samples (A) was cut into 100 solar cell samples (B) each of 1 cm × 1 cm in size.

The 100 solar cell samples (B) obtained from each of the single pin junction a-SiGe solar cell samples (A) were subjected to a measurement of shunt resistance in the dark by means of a conventional method. From the results obtained, the proportion of the solar cell samples (B) which exhibited a shunt resistance of at least 1 kΩ per 1 cm$^2$ was calculated with respect to each of the sample groups comprising the 100 solar cell samples (B), and the calculated result was deemed as the survival rate.

The results obtained are graphically shown in FIG. 1.

Experiment 1-2

The same procedures as in Experiment 1-1 were repeated, except for replacing the Cu film disposed on the stainless steel plate by an Ag film.

The results obtained are graphically shown in FIG. 2.

From the results shown in FIGS. 1 and 2, it was found that a high survival rate is maintained when the metal film comprising Cu or Ag disposed on the substrate (stainless steel plate) is of a thickness of at most 200 nm but when the metal film is of a thickness exceeding 200 nm, the survival rate is suddenly reduced.

The qualitative reasons for this could not be clarified at this point, but it was understood that in the case of a solar cell having a light reflection layer of a metal having a high reflectivity, the survival rate depends upon the thickness of the reflection layer.

EXPERIMENT 2

Experiment 2-1

There were provided a plurality of stainless steel plates having a flat surface provided with irregularities of less than 0.05 μm in maximum difference of evaluation (Rmax) as the substrate.

On each of the stainless steel substrates there was deposited an Al-Si film having a different thickness in the range of from 5 nm to 3000 nm by means of a conventional sputtering method, wherein a target comprising a material composed of Al and Si was sputtered while maintaining the stainless steel substrate at different temperatures.

Thus, there were obtained a plurality of base member samples each comprising a stainless steel plate having a flat surface of less than 0.05 μm in maximum difference of elevation (Rmax) and an Al-Si film of a different thickness in the range of from 5 nm to 3000 nm disposed on said stainless steel plate.

With respect to each of the base member samples, the relationship between the mean thickness of the Al-Si film and the maximum difference of elevation (Rmax) of the irregularities of the Al-Si film was observed with respect to the substrate temperature during forming of the Al-Si film by the sputtering method.

The results obtained are collectively shown in FIG. 3, wherein the results indicated by the marks X, ■, △, and ○ were obtained at respective substrate temperatures of from 200° C. to 400° C.; and the results indicated by the marks ● and □ were obtained at the respective substrate temperatures of 20° C. (room temperature) and 150° C.

From the results shown in FIG. 3, it was found that it is required to make the Al-Si film to be of a certain thickness in order to obtain a desired difference of elevation with respect to the irregularities of the Al-Si film formed on the uneven surface of the substrate.

Particularly, it was found that desired irregularities substantially corresponding to the film thickness can be formed on the surface of the substrate when the substrate temperature is controlled to be in the range of 200° C. or more, preferably 200° to 400° C., when forming said film by means of a sputtering method.

Experiment 2-2

There were provided a plurality of stainless steel plates having a flat surface provided with irregularities of less than 0.05 μm in maximum difference of elevation (Rmax) as the substrate.

On each of the stainless steel substrates there was deposited a Cu film having a different thickness in the range of from 5 nm to 3000 nm by means of a conventional sputtering method, wherein a Cu target was sputtered while maintaining the stainless steel substrate at different temperatures.

Thus, there were obtained a plurality of base member samples each comprising a stainless steel plate having a flat surface of less than 0.05 μm in maximum difference of elevation (Rmax) and a Cu film of a different thickness in the range of from 5 nm to 3000 nm disposed on said stainless steel plate.

With respect to each of the base member samples, the relationship between the mean thickness of the Cu film and the maximum difference of elevation (Rmax) of the irregularities of the Cu film was observed with respect to the substrate temperature during forming of the Cu film by the sputtering method.

As a result, results similar to those shown in FIG. 3 were obtained in Experiment 2-1.

From the results obtained, it was found that it is required to make the Cu film to be of a certain thickness in order to obtain a desired difference of elevation with respect to the irregularities of the Cu film formed on the uneven surface of the substrate.

Particularly, it was found that desired irregularities substantially corresponding to the thickness of the Cu film can be formed on the surface of the substrate when the substrate temperature is controlled to be in the range of 200° C. or more, preferably 200° to 400° C., when forming the Cu film by means of a sputtering method.

Experiment 2-3

There were provided a plurality of stainless steel plates having a flat surface provided with irregularities of less than 0.05 μm in maximum difference of elevation (Rmax) as the substrate.

On each of the stainless steel substrates there was deposited an Ag film having a different thickness in the range of from 5 nm to 3000 nm by means of a conventional sputtering method, wherein an Ag target was sputtered while maintaining the stainless steel substrate at different temperatures.

Thus, there were obtained a plurality of base member samples each comprising a stainless steel plate having a flat surface of less than 0.05 μm in maximum difference of elevation (Rmax) and an Ag film of a different thickness in the range of from 5 nm to 3000 nm disposed on said stainless steel plate.

With respect to each of the base member samples, the relationship between the mean thickness of the Ag film and the maximum difference of elevation (Rmax) of the irregularities of the Ag film was observed with respect to the substrate temperature during forming of the Ag film by the sputtering method.

Results similar to those shown in FIG. 3 were obtained in Experiment 2-1.

From the results obtained, it was found that it is required to make the Ag film to be of a certain thickness in order to obtain a desired difference of elevation with respect to the irregularities of the Ag film formed on the uneven surface of the substrate.

Particularly, it was found that desired irregularities substantially corresponding to the thickness of the Ag film can be formed on the surface of the substrate when the substrate temperature is controlled to be in the range of 200° C. or more, preferably 200° to 400° C., when forming the Cu film by means of sputtering method.

From the results obtained in Experiments 2-1 to 2-3, the following was found. That is, (a) in order to obtain a desired difference of elevation with respect to the irregularities of not only a film composed of a metallic material such as Al-Si material, etc. but also a film composed of a highly reflective metal such as Cu, Ag, etc. formed on the surface of the substrate, it is required to make such film to be of a certain thickness, and (b) in order to establish desired irregularities substantially corresponding to the film thickness of such films formed on the surface of the substrate by means of sputtering, the substance temperature must be controlled to a temperature in the range of 200° C. or more, preferably 200° to 400° C.

EXPERIMENT 3

There were provided a plurality of stainless steel plates having a flat surface provided with irregularities of less than 0.05 μm in maximum difference of elevation (Rmax) as the substrate.

On each of the stainless steel substrates there was deposited a Al-Si film having a different thickness in the range of from 5 nm to 3000 nm by means of a conventional sputtering method, wherein a target comprising a material composed of Al and Si was sputtered while maintaining the stainless steel substrate at different temperatures.

Thus, there were obtained a plurality of base member samples each comprising a stainless steel plate having a flat surface of less than 0.05 μm in maximum difference of elevation (Rmax) and an Al-Si film of a different thickness in the range of from 5 nm to 3000 nm disposed on said stainless steel plate.

On the Al-Si film of each of said plurality of base member samples there was formed a pin junction semiconductor layer comprising an n-type amorphous silicon film (n-type a-Si film), an i-type amorphous silicon-germanium film (i-type a-SiGe film), and a p-type microcrystalline silicon film successively laminated from the side of the substrate by means of a conventional plasma CVD method, wherein said i-type a-SiGe film was made to have a thickness of 250 nm. Successively, there was formed a 70 nm thick ITO film on the pin junction semiconductor layer by means of a conventional evaporation method. Finally, on the ITO film there was formed a collecting electrode comprising an Al film by means of a conventional evaporation method. Thus, there were obtained a plurality of single pin junction a-SiGe solar cell samples (A) each being different in the thickness of the Al-Si film disposed on the stainless steel plate. The i-type a-SiGe film of each of the resultant a-SiGe solar cell samples (A) was found to have an optical band gap (Eg) of 1.48 eV.

Each of the resultant a-SiGe solar cell samples (A) was cut into 100 solar cell samples (B) each of 1 cm×1 cm in size.

The 100 solar cell samples (B) obtained from each of the single pin junction a-SiGe solar cell samples (A) were subjected to a measurement of shunt resistance in the dark by means of a conventional method.

With respect to each of the sample groups respectively comprising the 100 solar cell samples (B), 10 solar cell samples which exhibited a shunt resistance of 1 kΩ per $cm^2$ or above were selected, and they were subjected to measurement of short-circuit current (Jsc) by means of a solar simulator wherein pseudo sun light of AM 1.5 with an intensity of 100 mW was irradiated at a temperature of 25° C. The mean value of Jsc was obtained with respect to each of the solar cell sample groups each comprising the selected 10 solar cell samples.

Separately, there was prepared a comparative a-SiGe solar cell sample (A') by repeating the above procedures for the preparation of the foregoing single pin junction a-SiGe solar cell sample (A), except that the step of forming the Al-Si film on the surface of the substrate was not carried out. The resultant comparative a-SiGe solar cell sample (A') was cut into 100 solar cell samples (B') each of 1 cm×1 cm in size. The 100 comparative solar cell samples (B') obtained from the comparative single pin junction a-SiGe solar cell samples (A') were subjected to measurement of shunt resistance in the dark by means of a conventional method. Of these 100 comparative solar cell samples (B'), 10 comparative solar cell samples which exhibited a shunt resistance of 1 kΩ per $cm^2$ or above were selected, and they were subjected to measurement of short-circuit current (Jsc) by means of a solar simulator wherein pseudo sun light of AM 1.5 with an intensity of 100 mW was irradiated at a temperature of 25° C. The mean value of Jsc was obtained with respect to the selected 10 comparative solar cell samples. This mean value obtained with respect to the comparative a-SiGe solar cell sample (A') was made a standard for comparison purposes.

The results obtained are graphically shown in FIG. 4, in which each of the resultant mean values of Jsc with respect to the single pin junction a-SiGe solar cell samples (A) is shown relative to the standard mean value of Jsc of the comparative single pin junction a-SiGe solar cell samples (A'), which was set at 1.

From the results shown in FIG. 4, the following was found. That is, as for the single pin junction solar cell with a light reflection layer provided with irregularities which provide a large shunt resistance of 1 kΩ per 1 $cm^2$ or above (which means that the number of shunt portions between opposite electrodes is few), the greater the maximum difference of elevation (Rmax) with respect to the irregularities of the light reflection layer, the greater the value of Jsc (short-circuit current).

EXPERIMENT 4

Experiment 4-1

There were provided a plurality of stainless steel plates having a flat surface provided with irregularities of 0.05 μm or less in maximum difference of elevation (Rmax) as the substrate.

On each of the stainless steel substrates there was deposited a Cu film of a different thickness in the range of from 5 nm to 500 nm by means of a conventional sputtering method, wherein a Cu target was sputtered while maintaining the stainless steel substrate at a temperature of about 350° C.

Thus, there were obtained a plurality of base member samples each comprising a stainless steel plate having a flat surface of 0.05 μm or less in maximum difference of elevation (Rmax) and a Cu film of a different thickness in the range of from 5 nm to 500 nm disposed on said stainless steel plate.

On the Cu film of each of said plurality of base member samples there was formed a pin junction semiconductor layer comprising an n-type amorphous silicon film (n-type a-SiGe film), an i-type amorphous silicon. germanium film (i-type a-SiGe film), and a p-type microcrystalline silicon film successively laminated from the side of the substrate by means of a conventional plasma CVD method, wherein said i-type a-SiGe film was made to have a thickness of 250 nm. Next, there was formed a 70 nm thick ITO film on the pin junction semiconductor layer by means of a conventional evaporation method. Finally, on the ITO film there was formed a collecting electrode comprising an Al film by means of a conventional evaporation method. Thus, there were obtained a plurality of single pin junction a-SiGe solar cell samples (A-1) each being different in the thickness of the Cu film disposed on the stainless steel plate. The i-type a-SiGe film of each of the resultant a-SiGe solar cell samples (A-1) was found to have an optical band gap (Eg) of 1.48 eV.

Each of the resultant a-SiGe solar cell samples (A-1) was cut into 100 solar cell samples (B-1) each of 1 cm×1 cm in size.

The 100 solar cell samples (B-1) obtained from each of the single pin junction a-SiGe solar cell samples (A-1) were subjected to a measurement of shunt resistance in the dark by means of a conventional method.

With respect to each of the sample groups each comprising the 100 solar cell samples (B-1), 10 solar cell samples which exhibited a shunt resistance of 1 kΩ per cm² or above were selected, and they were subjected to measurement of short-circuit current (Jsc) by means of a solar simulator wherein pseudo sun light of AM 1.5 with an intensity of 100 mW was irradiated at a temperature of 25° C. The mean value of Jsc was obtained with respect to each of the solar cell sample groups each comprising the selected 10 solar cell samples.

Separately, there was prepared a comparative a-SiGe solar cell sample (A'-1) by repeating the above procedures for the preparation of the foregoing single pin junction a-SiGe solar cell sample (A-1), except that the step of forming the Cu film on the surface of the substrate was not carried out. The resultant comparative a-SiGe solar cell sample (A'-1) was cut into 100 solar cell samples (B'-1) respectively of 1 cm×1 cm in size. The 100 comparative solar cell samples (B'-1) obtained from the comparative single pin junction a-SiGe solar cell samples (A'-1) were subjected to measurement of shunt resistance in the dark by means of a conventional method. Of these 100 comparative solar cell samples (B'-1), 10 comparative solar cell samples which exhibited a shunt resistance of 1 kΩ per cm² or above were selected, and they were subjected to measurement of short-circuit current (Jsc) by means of a solar simulator wherein pseudo sun light of AM 1.5 with an intensity of 100 mW was irradiated at a temperature of 25° C. The mean value of Jsc was obtained with respect to the selected 10 comparative solar cell samples. This mean value obtained with respect to the comparative a-SiGe solar cell sample (A'-1) was made a standard for comparison purposes.

The results obtained are graphically shown in FIG. 5, in which each of the resultant mean values of Jsc with respect to the single pin junction a-SiGe solar cell samples (A-1) is shown relative to the standard mean value of Jsc of the comparative single pin junction a-SiGe solar cell samples (A'-1), which was set to 1.

Experiment 4-2

There were provided a plurality of stainless steel plates having a flat surface provided with irregularities of 0.05 μm or less in maximum difference of elevation (Rmax) as the substrate.

On each of the stainless steel substrates there was deposited a Ag film of a different thickness in the range of from 5 nm to 500 nm by means of a conventional sputtering method, wherein a Ag target was sputtered while maintaining the stainless steel substrate at a temperature of about 350° C.

Thus, there were obtained a plurality of base member samples each comprising a stainless steel plate having a flat surface of 0.05 μm or less in maximum difference of elevation (Rmax) and a Ag film of a different thickness in the range of from 5 nm to 500 nm disposed on said stainless steel plate.

On the Ag film of each of said plurality of base member samples there was formed a pin junction semiconductor layer comprising an n-type amorphous silicon film (n-type a-Si film), an i-type amorphous silicon-germanium film (i-type a-SiGe film), and a p-type microcrystalline silicon film successively laminated from the side of the substrate by means of conventional plasma CVD method, wherein said i-type a-SiGe film was made to have a thickness of 250 nm. Next, there was formed a 70 nm thick ITO film on the pin junction semiconductor layer by means of a conventional evaporation method. Finally, on the ITO film there was formed a collecting electrode comprising an Al film by means of a conventional evaporation method. Thus, there were obtained a plurality of single pin junction a-SiGe solar cell samples (A-2) each being different in the thickness of the Ag film disposed on the stainless steel plate. The i-type a-SiGe film of each of the resultant a-SiGe solar cell samples (A-2) was found to have an optical band gap (Eg) of 1.48 eV.

Each of the resultant a-SiGe solar cell samples (A-2) was cut into 100 solar cell samples (B-2) each of 1 cm×1 cm in size.

The 100 solar cell samples (B-2) obtained from each of the single pin junction a-SiGe solar cell samples (A-2) were subjected to a measurement of shunt resistance in the dark by means of a conventional method.

With respect to each of the sample groups each comprising the 100 solar cell samples (B-2), 10 solar cell samples which exhibited a shunt resistance of 1 kΩ per cm² or above were selected, and they were subjected to measurement of short-circuit current (Jsc) by means of a solar simulator wherein pseudo sun light of AM 1.5 with an intensity of 100 mW was irradiated at a temperature of 25° C. The mean value of Jsc was obtained with respect to each of the solar cell sample groups each comprising the selected 10 solar cell samples.

Separately, there was prepared a comparative a-SiGe solar cell sample (A'-2) by repeating the above procedures for the preparation of the foregoing single pin junction a-SiGe solar cell sample (A-2), except that the step of forming the Ag film on the surface of the substrate was not carried out. The resultant comparative a-SiGe solar cell sample (A'-2) was cut into 100 solar cell samples (B'-2) respectively of 1 cm×1 cm in size. The 100 comparative solar cell samples (B'-2) obtained from the comparative single pin junction a-SiGe solar cell samples (A'-2) were subjected to measurement of shunt resistance in the dark by means of a conventional method. Of these 100 comparative solar cell samples (B'-2), 10 comparative solar cell samples which exhibited a shunt resistance of 1 kΩ per cm² or above were selected, and they were subjected to measurement of short-circuit current (Jsc) by means of a solar simulator wherein pseudo sun light of AM 1.5 with an intensity of 100 mW was irradiated at a temperature of 25° C. The mean value of Jsc was obtained with respect to the selected 10 comparative solar cells samples. This mean value obtained with respect to the comparative a-SiGe solar cell sample (A'-2) was made a standard for comparison purposes.

The results obtained are graphically shown in FIG. 6, in which each of the resultant mean values of Jsc with respect to the single pin junction a-SiGe solar cell samples (A-2) is shown by a value relative to the standard mean value of Jsc of the comparative single pin junction a-SiGe solar cell samples (A'-2), which was set at 1.

From the results shown in FIGS. 5 and 6, the following was found. That is, as for the pin junction solar cell with light reflection layer provided with irregularities, in order to obtain a desirably large Jsc, the light reflection layer is required to have a certain thickness of at least 200 nm and preferably 400 nm or more.

As a result of further studies based on the foregoing results obtained in Experiments 1 to 4, the present inventor obtained the following knowledge about solar cells comprising a substrate having a flat surface, a light reflection layer which is disposed on the surface of said substrate and has a roughened surface provided with irregularities, and a semiconductor active layer disposed on the roughened surface of said light reflection layer. That is, one of the key factors to improve the short-circuit current (Jsc) outputted from the solar cell is to increase the maximum difference of elevation (Rmax) of the irregularities of the light reflection layer as much as possible, and in order to attain this, it is necessary to thicken the light reflection layer to a certain extent. In the case where the light reflection layer is made to be of thickness of 200 nm or more, the short-circuit current (Jsc) outputted from the solar cell is improved, however, there is caused a disadvantage in that the number of shunt portions between the opposite electrodes is increased, resulting in a reduction of the yield (i.e. foregoing survival rate). In order to stably attain a desirably high yield of the solar cells to be produced, a light reflection layer composed of a highly reflective metal such as Cu, Ag, etc. must be controlled to a thickness of 150 nm or less. It is generally known that the diffusion of the constituent material of the light reflection layer into the semiconductor active layer is smaller in the case where the light reflection layer is composed of a highly reflective metal such as Cu, Ag, etc. in comparison with the case where the light reflection layer is composed of a metallic material such as Al, Al-Si, etc. In view of this, it is desired for the light reflection layer to be composed of a highly reflective metal such as Cu, Ag, etc. and provided with irregularities having a desirably large maximum difference of elevation (Rmax) at the surface thereof, but there is an upper limit as above mentioned for the thickness of the light reflection layer in this case.

The present invention has been accomplished based on the above findings obtained through experimental studies by the present inventor.

The present invention is an improved solar cell provided with a light reflection layer functionally divided into two layers: a first light scattering layer having a roughened surface provided with desirable irregularities with a maximum difference of elevation (Rmax) and capable of effectively scattering incident light and contributing to improving the short-circuit current (Jsc), and a second, thin layer with a high reflectivity (hereinafter referred to as highly reflective thin layer) which is disposed on the entire roughened surface of said light scattering layer. The solar cell having this specific light reflection layer according to the present invention provides an improved short-circuit current (Jsc) and can be mass-produced at an improved yield. Particularly, the solar cell according to the present invention is of the constitution such that said highly reflective thin layer capable of contributing to preventing the yield (i.e., the foregoing survival rate) from being reduced is interposed between said light scattering layer disposed on the surface of a substrate and the semiconductor active layer, wherein the highly reflective thin layer contributes to preventing the constituent material of the light scattering layer from migrating (diffusing) into the semiconductor active layer and to reflect and scatter incident light. Because of this constitution, the solar cell of the present invention attains a high light reflection without occurrence of migration (diffusion) of the constituent material thereof into the semiconductor active layer to result in an improved short-circuit current (Jsc), and it can be mass-produced at an improved yield.

BRIEF DESCRIPTION OF THE DRAWINGS

FIG. 8(A) is a graph showing the interrelation between the thickness of a light reflection layer formed of a Cu film and the survival rate of solar cells having a light reflection layer formed of the Cu film.

FIG. 8(B) is a graph showing the interrelation between the thickness of a light reflection layer formed of a Cu film and the solar cell characteristics of a solar cell having a light reflection layer formed of the Cu film.

FIG. 9(A) is a graph showing the interrelation between the thickness of a light reflection layer formed of an Ag film and the survival rate of solar cells having a light reflection layer formed of the Ag film.

FIG. 9(B) is a graph showing the interrelation between the thickness of a light reflection layer formed of an Ag film and the solar cell characteristics of a solar cell having a light reflection layer formed of the Ag film.

FIG. 15 is a graph showing the interrelation between the thickness of a highly reflective thin layer and the short-circuit current (Jsc) of the solar cells obtained in the Examples of the present invention (which will be later described) and the comparative solar cells obtained in Comparative Examples (which will be later described).

DETAILED DESCRIPTION OF THE PREFERRED EMBODIMENTS

The present invention will now be described by reference to the typical embodiments which are provided for illustrative purposes. The present invention is not restricted by these embodiments. These embodiments can be optionally modified as long as the objects of the present invention are attained.

Figure 1:
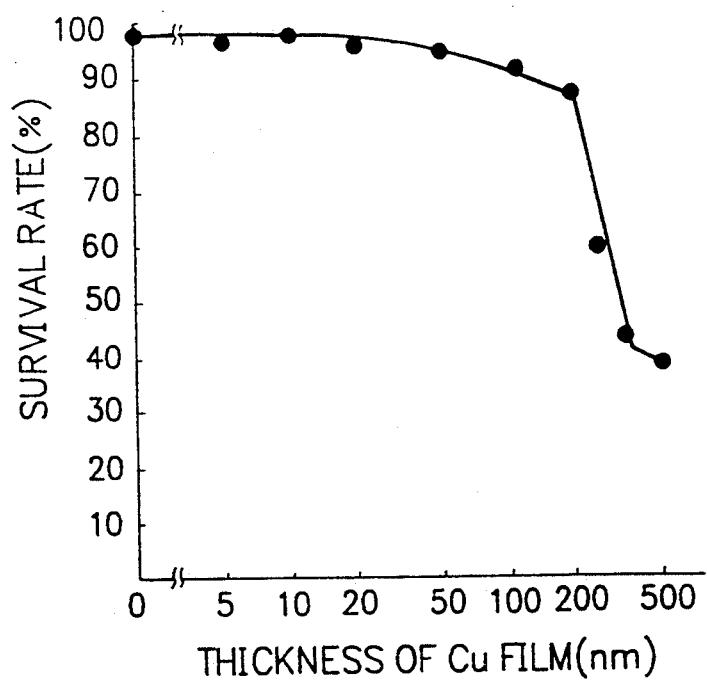
FIG. 1 is a graph obtained in Experiment 1 which shows the interrelation between the thickness of a Cu film as a light reflection layer and the survival rate of solar cells having a light reflection layer formed of the Cu film.
Figure 2:
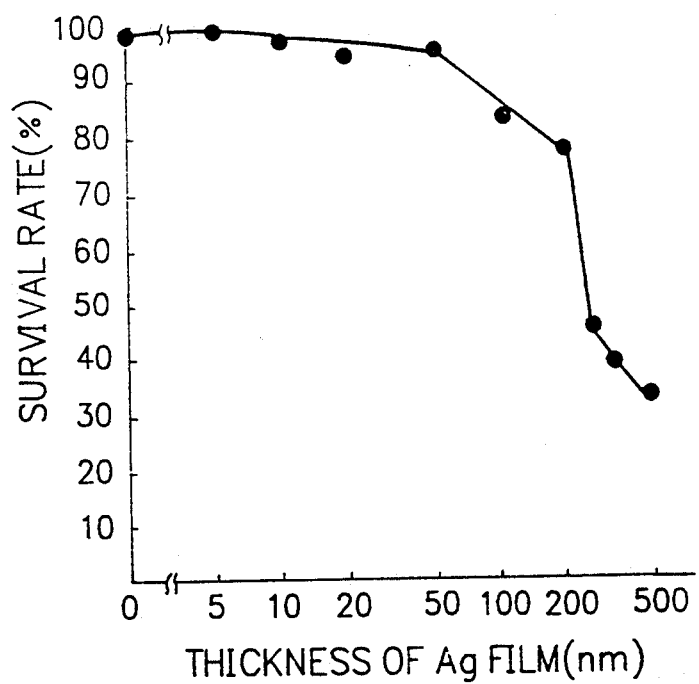
FIG. 2 is a graph obtained in Experiment 1 which shows the interrelation between the thickness of an Ag film as a light reflection layer and the survival rate of solar cells having a light reflection layer formed of the Ag film.
Figure 3:
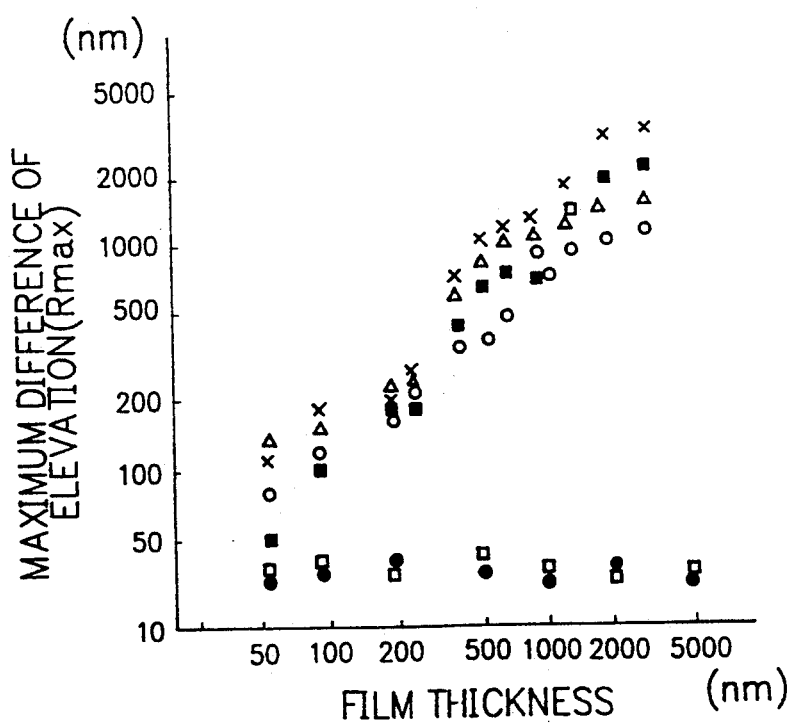
FIG. 3 is a graph obtained in Experiment 2 which shows the interrelation between the thickness of the light reflection layer and the maximum difference of elevation (Rmax) of irregularities at the surface thereof.
Figure 4:
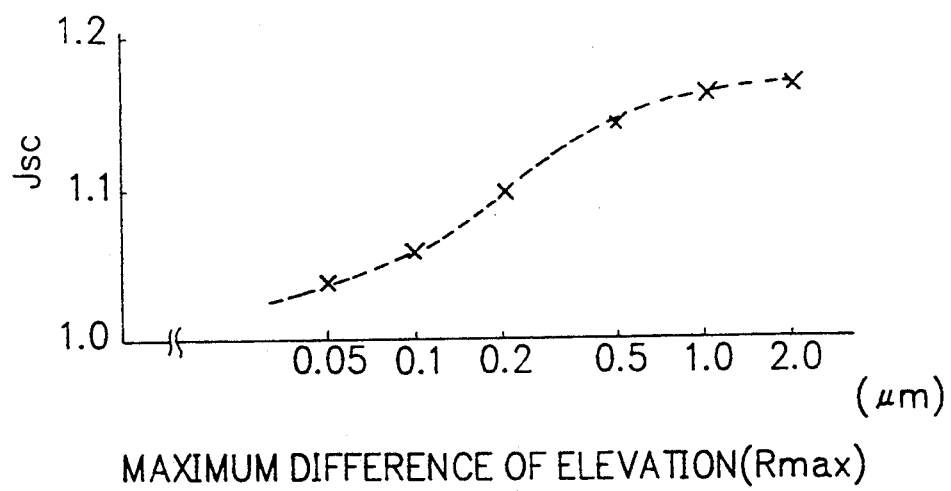
FIG. 4 is a graph obtained in Experiment 3 which shows the interrelation between the maximum difference of elevation (Rmax) of irregularities formed at the surface of the light reflection layer and the short-circuit current (Jsc) outputted from the solar cell.
Figure 5:
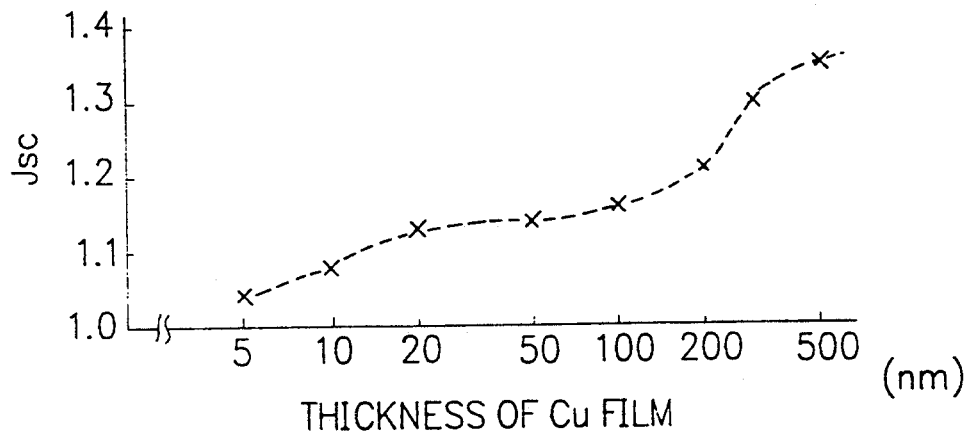
FIG. 5 is a graph obtained in Experiment 4 which shows the interrelation between the thickness of a light reflection layer formed of a Cu film and the short-circuit current (Jsc) outputted from a solar cell having a light reflection layer formed of the Cu film.
Figure 6:
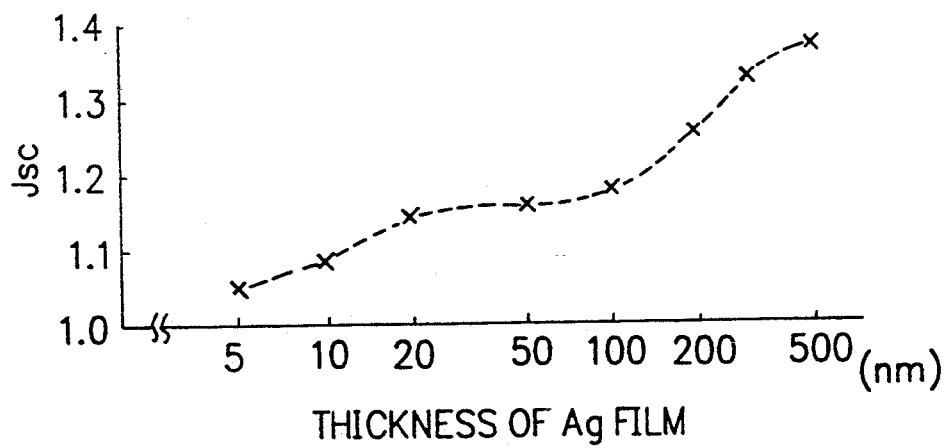
FIG. 6 is a graph obtained in Experiment 4 which shows the interrelation between the thickness of a light reflection layer formed of an Ag film and the short-circuit current (Jsc) outputted from a solar cell having a light reflection layer formed of the Ag film.
Figure 7:
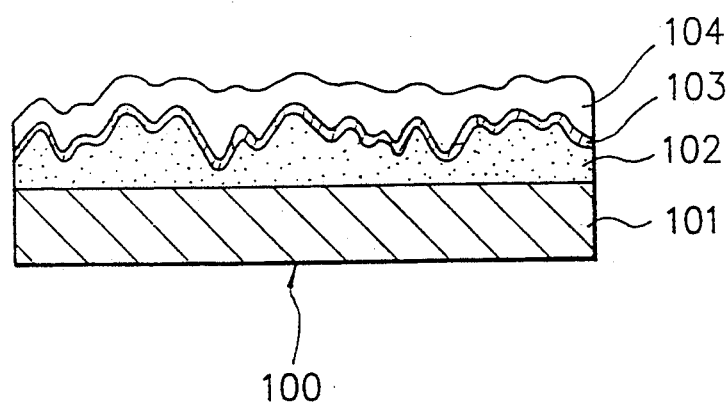
FIG. 7 is a schematic cross section view illustrating the constitution of a typical example of the light reflection layer of a solar cell according to the present invention.

In FIG. 7 is a schematic cross section view illustrating a typical example of the constitution of the light reflection layer to be employed in solar cells according to the present invention.

In FIG. 7, reference numeral 100 stands for the entire base member (including the light reflection layer comprising a light scattering layer and a highly reflective thin layer) on which a semiconductor active layer (not shown in the figure) is formed. The base member 100 comprises a substrate 101, a light scattering layer 102 disposed on the surface of said substrate 101, said light scattering layer having a roughened surface provided with irregularities with a desired maximum difference of elevation (Rmax) and a highly reflective thin layer 103 disposed on the roughened surface of said light scattering layer 103. Reference numeral 104 stands for a transparent and conductive layer which is optionally disposed on the surface of said highly reflective thin layer 103.

The light scattering layer 102 is composed of an appropriate metal or alloy. The irregularities formed at the surface of the light scattering layer 102 are desired to be formed so that their maximum difference of elevation (peak to valley) (Rmax) is in the range of 0.2 $\mu$m to 2.0 $\mu$m.

The highly reflective thin layer 103 is composed of metal with a reflectivity of more than 95% (less than 5% light absorption). The highly reflective thin layer 103 is formed on the roughened surface of the light scattering layer 102 such that it covers the entire roughened surface of the light scattering layer to provide irregularities corresponding to the irregularities of the light scattering layer at the surface thereof. The thickness of the highly reflective thin layer 103 is within the range of being smaller than the thickness of the light scattering layer 102 and maintaining the configuration of the irregularities formed at the surface of the light scattering layer 102. In addition, the highly reflective thin layer 103 is desired to have a substantially uniform thickness on the roughened surface of the light scattering layer 102. In general, the thickness of the highly reflective thin layer 103 is in the range of 10 nm to 150 nm.

In the following, explanation will be made of each of the constituents of the base member 100.

The substrate 101 may be electroconductive or electrically insulating. The electroconductive substrate can include, for example, plate or film-like members of metals such as Mo, W, Ti, Co, Cr, Ni, Fe, Ta, Nb, Zr, Al, etc. and alloys of these metals such as stainless steel and Ni-Cr alloy. Among these, plate or film-like members of stainless steel, Ni-Cr alloy, Ni, Ta, Nb, Zr, Ti and alloys of these metals are most appropriate in view of their good corrosion resistance.

The electrically insulating substrate can include, for example, films or sheets of inorganic materials such as alkali free glass, ceramics, etc. or synthetic resins such as polyester, polyethylene, polycarbonate, cellulose acetate, polypropylene, polyvinyl chloride, polyvinylidene chloride, polystyrene, polyamide, etc.

The electroconductive substrate may comprise a member made of such metal or alloy as above mentioned which has a coating comprising any of the foregoing synthetic resins on the rear face thereof.

The light scattering layer 102 is composed of a metal, alloy, or other metallic material As the metal, there can be illustrated Mo, W, Ti, Co, Cr, Ni, Fe, Cu, Ag, Ta, Nb, Zr, and Al. As the alloy, there can be illustrated alloys of said metals. As the metallic material, there can be illustrated metallic materials comprising Si and one or more metals such as Al, Ni, Fe, Cu, Ag, etc. In a preferred embodiment, the light scattering layer 102 is composed of said metallic material.

The irregularities formed at the surface of the light scattering layer 102 are desired to be formed so that their maximum difference of elevation (peak to valley) (Rmax) is in the range of 0.2 $\mu$m to 2.0 $\mu$m.

The highly reflective thin layer 103 is composed of a metal with a reflectivity of more than 95% (less than 5% light absorption). As such metal, there can be illustrated Cu, Ag, etc.

The highly reflective thin layer 103 is formed such that it covers the entire roughened surface of the light scattering layer 102 to provide irregularities corresponding to the irregularities of the light scattering layer at the surface thereof. The irregularities formed at the surface of the highly reflective thin layer 103 are configured such that incident light is effectively scattered by them. The thickness of the highly reflective thin layer 103 is within the range of being smaller than the thickness of the light scattering layer 102 and maintaining the configuration of the irregularities formed at the surface of the light scattering layer 102. In addition, the highly reflective thin layer 103 is desired to have a substantially uniform thickness on the roughened surface of the light scattering layer 102. In general, the thickness of the highly reflective thin layer 103 is selected in the range of 10 nm to 150 nm.

The transparent and conductive layer 104 to be optionally disposed on the surface of the highly reflective thin layer 103 is formed of thin film of a metal oxide material such as ZnO, $SnO_2$, $In_2O_3$, $TiO_2$, CdO, $Cd_2SnO_4$, ITO ($In_2O_3+SnO_2$), etc. The transparent and conductive layer 104 contributes to improving the light scattering effect. The thickness of the transparent and conductive layer 104 is from 0.05 $\mu$m to 0.5 $\mu$m.

The base member 100 may be prepared by a conventional film-forming method. For example, a member to be the substrate 101 is firstly provided. The substrate member 101 is placed in a film-forming chamber, wherein a metal or alloy film to be the light scattering layer 102 is formed on said substrate member by subjecting an appropriate metal or alloy to thermal evaporation or sputtering while maintaining said member at a temperature of 200° to 400° C. In this case, the resulting metal or alloy film is formed with appropriate irregularities at the surface thereof which depend on the thickness of metal or alloy film as long as the temperature of the substrate member during film formation is maintained at a relatively high value (that is, 200° to 400° C.). On the other hand, in the case where the temperature of the substrate member during film formation is maintained at a relatively low temperature, such irregularities are not formed at the surface of the resulting metal or alloy film. The conditions for providing desirable irregularities with a maximum difference of elevation (peak to valley) (Rmax) in the range of 0.2 μm to 2.0 μm at the surface of the resulting metal or alloy film are determined by the interrelation between the substrate temperature of 200° to 400° C. upon film formation and the thickness of the metal or alloy film to be formed. In order to make the irregularities formed at the surface of the metal or alloy film more desirable, the metal or alloy film provided with those irregularities at the surface thereof is subjected to dry-etching, wet-etching or sandblasting.

The highly reflective thin layer 103 having a roughened surface provided with irregularities corresponding to the irregularities of the light scattering layer 102 is formed by subjecting a metal with a high reflectivity to heat evaporation or sputtering while maintaining the substrate at a temperature of from room temperature to 150° C. In this case, due care should be given so that said metal film to be the highly reflective thin layer 103 is formed at a uniform thickness on the entire roughened surface of the light scattering layer 102 without hindering the configuration of the irregularities formed at the surface of the light scattering layer.

The transparent and conductive layer 104 to be optionally disposed on the roughened surface of the highly reflective thin layer 103 may be formed by means of a conventional spraying technique, CVD technique, heat evaporation technique, or sputtering technique.

The solar cell having the foregoing base member 100 (i.e. solar cell substrate) according to the present invention attains an improvement in light reflection without occurrence of migration (diffusion) of the constituent material of the light reflection layer into the semiconductor active layer, resulting in an improved, stable short-circuit current (Jsc), and it can be mass-produced at an improved yield.

In the following, explanation will be made of a solar cell provided with the foregoing base member 100 according to the present invention.

The base member 100 may be applicable in various thin film solar cells having a sensitivity to light having a wavelength of 600 nm or above, wherein light is impinged through the substrate side.

Such thin film solar cells include amorphous thin film solar cells having a semiconductor active layer comprising an amorphous semiconductor such as amorphous silicon (a-Si), amorphous silicon germanium (a-SiGe), amorphous silicon carbide (a-SiC), etc.; polycrystal thin film solar cells having a semiconductor active layer comprising a polycrystalline semiconductor such as polycrystalline silicon, etc.; thin film solar cells having a semiconductor active layer comprising a Group II-VI compound semiconductor such as CdS, CdTe, etc.; and other thin film solar cells having a semiconductor active layer comprising a Group I-III-VI compound semiconductor such as CuInSe$_2$, etc. These solar cells have at least a pn junction or pin junction and are provided with a transparent and conductive layer on the side through which light is impinged.

These solar cells provided with the foregoing base member according to the present invention provide an improved photoelectric conversion efficiency since long wavelength light which passes through their semiconductor active layer is effectively reflected and scattered at the substrate side, thereby outputting an improved short-circuit current (Jsc).

Figure 10:
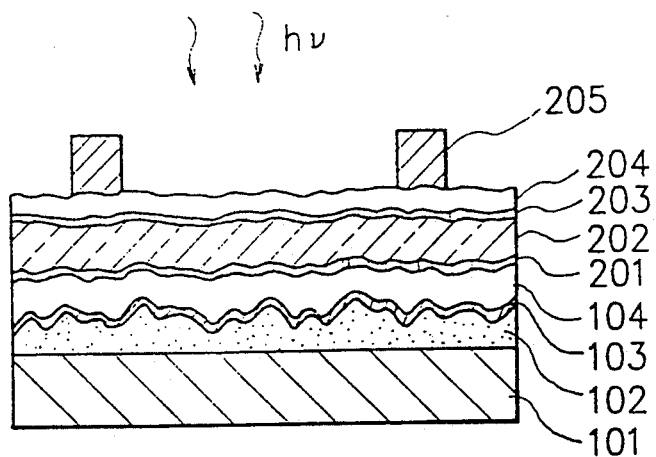
FIG. 10 is a schematic cross section view of an example of the constitution of the solar cell according to the present invention.
Figure 12:
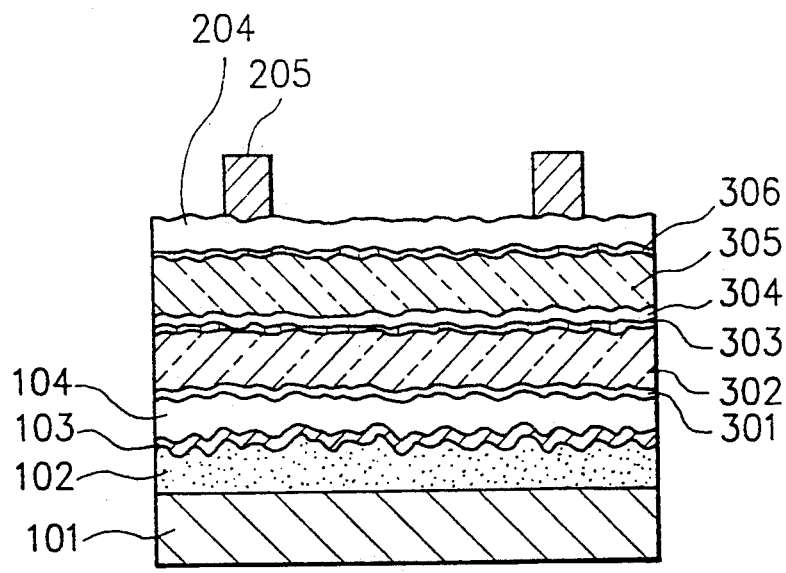
FIG. 12 is a schematic cross section view of the constitution of another solar cell according to the present invention.
Figure 13:
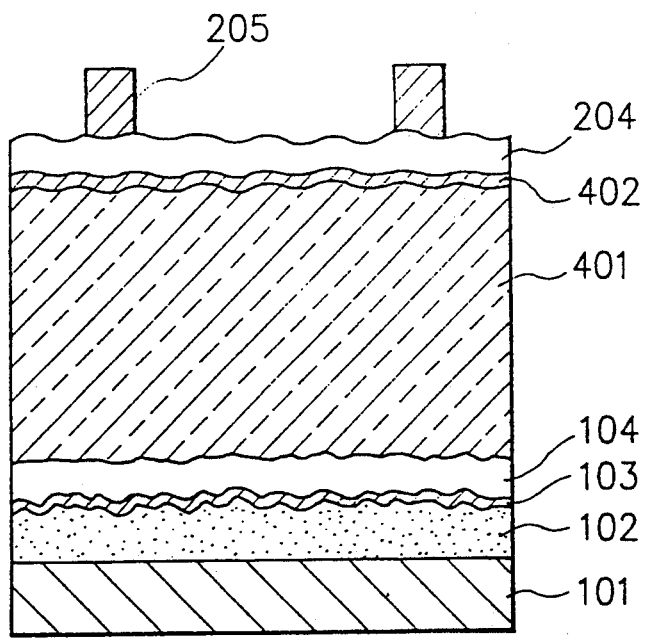
FIG. 13 is a schematic cross section view of the constitution of a further solar cell according to the present invention.

Typical configurations of the solar cells provided with the foregoing base member according to the present invention are, for example, as shown in FIG. 10, FIG. 12, and FIG. 13.

The solar cell shown in FIG. 10 comprises the base member 100 shown in FIG. 7 (comprising substrate 101, light scattering layer 102, highly reflective thin layer 103, and transparent and conductive layer 104), a semiconductor active layer disposed on the transparent and conductive layer 104, said semiconductor active layer comprising an n-type semiconductor layer 201, an i-type semiconductor layer 202, and a p-type semiconductor layer 203 laminated in this order from the side of the transparent and conductive layer 104, a transparent and conductive layer 204 (i.e. transparent upper electrode) disposed on the p-type semiconductor layer, and a collecting electrode 205 disposed on the transparent and conductive layer 204.

The solar cell shown in FIG. 12 comprises the base member 100 shown in FIG. 7 (comprising substrate 101, light scattering layer 102, highly reflective thin layer 103, and transparent and conductive layer 104), a semiconductor active layer disposed on the transparent and conductive layer 104, said semiconductor active layer comprising an n-type semiconductor layer 301, an i-type semiconductor layer 302, a p-type semiconductor layer 303, an n-type semiconductor layer 304, an i-type semiconductor layer 305, and a p-type semiconductor layer 306 laminated in this order from the side of the transparent and conductive layer 104, a transparent and conductive layer 204 (i.e. transparent upper electrode) disposed on the p-type semiconductor layer 306, and a collecting electrode 205 disposed on the transparent and conductive layer 204.

The solar cell shown in FIG. 13 comprises the base member 100 shown in FIG. 7 (comprising substrate 101, light scattering layer 102, highly reflective thin layer 103, and transparent and conductive layer 104), a semiconductor active layer disposed on the transparent and conductive layer 104, said semiconductor active layer comprising a p-type semiconductor layer 401 and an n-type semiconductor layer 402 laminated in this order from the side of the transparent and conductive layer 104, a transparent and conductive layer 204 (i.e. transparent upper electrode) disposed on the n-type semiconductor layer 402, and a collecting electrode 205 disposed on the transparent and conductive layer 204.

The semiconductor active layer in the solar cell according to the present invention may be properly formed by a conventional film-forming technique. For example, in the case where the constituent semiconductor layer is composed of an amorphous material or a polycrystal line silicon material, such semiconductor layer may be formed by means of a conventional plasma CVD technique, light-induced CVD technique, or thermally induced CVD technique. In the case where the constituent semiconductor layer is composed of a Group II-VI compound semiconductor or a Group I-III-VI compound semiconductor, such semiconductor layer may be formed by means of conventional sputtering technique, spraying technique, or printing technique.

The transparent and conductive layer 204 (transparent upper electrode) in the solar cell according to the present invention is desired to have a light transmittance of more than 85% so that it allows the semiconductor active layer to efficiently absorb incident light. In addition to this, it is desired to have a sheet resistance of 100 Ω or less from the viewpoint of preventing the internal resistance of the pn or pin junction solar cell from becoming great, thereby impairing the performance.

In view of the above, the transparent and conductive layer 204 is desired to comprise a thin film of a metal oxide selected from the group consisting of $SnO_2$, $In_2O_3$, ZnO, CdO, $Cd_2SnO_4$, and ITO ($In_2O_3+SnO_2$), or a semitransparent thin film of a metal selected from the group consisting of Au, Al, and Cu.

The transparent and conductive layer 204 comprising such thin film may be properly formed by means of a conventional resistance heating deposition technique, electron beam heating deposition technique, sputtering technique, or spraying technique.

The collecting electrode 205 is disposed on the transparent and conductive layer 204 for the purpose of reducing the surface resistance of the transparent and conductive layer.

The collecting electrode 205 is desired to comprise a thin film of a member selected from the group consisting of Ag, Cr, Ni, Al, Au, Ti, Pt, Cu, Mo, and alloys of these metals. It is possible for the collecting electrode to be constituted by a member comprising a plurality of such metallic thin films laminated together.

The shape and the area of the collecting electrode 205 should be properly designed so that a sufficient quantity of light can be received by the semiconductor active layer. Specifically as for the shape, it is desired to be such that it extends uniformly all over the light receiving face of the solar cell. As for the area, it is desired that it cover 15% or less of said light receiving face in a preferred embodiment or 10% or less in a more preferred embodiment.

The member constituting the collecting electrode 205 is of a sheet resistance preferably of 50 Ω or less, more preferably of 10 Ω or less.

The advantages of the present invention will be described in more detail by reference to the following Examples, which are provided merely for illustrative purposes and are not intended to limit the scope of the present invention.

EXAMPLES 1 AND 2

Example 1

There were provided a plurality of well-cleaned SUS 304 stainless steel plates having a flat surface provided with irregularities of less than 0.05 μm in maximum difference of elevation (Rmax) as the substrate 101.

On each of the stainless steel substrates there was deposited a Al-Si film of 0.5 μm in mean thickness as the light scattering layer 102 by means of a conventional sputtering method, wherein a target comprising a metallic material composed of Al with Si in an amount of 5 atomic % was sputtered while maintaining the stainless steel substrate at a temperature of 380° C. The Al-Si film as the light scattering layer 102 formed on the stainless steel substrate in this case was found to have a roughened surface provided with irregularities of 0.8 μm in maximum difference of elevation (Rmax). Successively, there were deposited on the roughened surface of the Al-Si light scattering layer 102 a Cu thin film as the highly reflective thin layer 103 of a different thickness in the range of 5 nm to 500 nm by means of a conventional electron beam evaporation method while exercising care so that the irregularities formed at the surface of the Al-Si film were not deformed, wherein a Cu-containing source was subjected to electron beam evaporation while maintaining the substrate at room temperature and controlling the film formation period.

Thus, there were obtained a plurality of base member samples 100 each comprising an Al-Si film of 0.5 μm in mean thickness having a roughened surface provided with irregularities of 0.8 μm in maximum difference of elevation (Rmax) as the light scattering layer 102 and a Cu thin film of a different thickness in the range of 5 nm to 500 nm as the highly reflective thin layer 103 being disposed in this order on the flat surface of less than 0.05 μm in maximum difference of elevation (Rmax) of a stainless steel plate as the substrate 101.

On the Cu thin film 103 of each of said plurality of base member samples there were successively formed an n-type amorphous silicon (a-Si) semiconductor film, an i-type amorphous silicon germanium (a-SiGe) semiconductor film, and a p-type microcrystal silicon semiconductor film by means of a conventional plasma CVD method, wherein said i-type a-SiGe semiconductor film had a thickness of 250 nm. Thus, there was formed a pin junction semiconductor layer as the semiconductor active layer. Next, there was formed a 70 nm thick ITO film as the transparent and conductive layer by means of a conventional evaporation method. Finally, on the ITO film there was formed an Al film as the collecting electrode by means of a conventional evaporation method. Thus, there were obtained a plurality of single pin junction a-SiGe solar cell samples (A) each being different in the thickness of the Cu film as the highly reflective thin layer 103. The i-type a-SiGe film of each of the resultant a-SiGe solar cell samples (A) was found to have an optical band gap (Eg) of 1.48 eV.

Each of the resultant a-SiGe solar cell samples (A) was cut into 100 solar cell samples (B) respectively of 1 cm×1 cm in size.

The 100 solar cell samples (B) obtained from each of the single pin junction a-SiGe solar cell samples (A) were subjected to measurement of shunt resistance in the dark by means of a conventional method. From the results obtained, the proportion of the solar cell samples (B) which exhibited a shunt resistance of at least 1 kΩ per 1 cm² was calculated with respect to each of the sample groups respectively comprising the 100 solar cell samples (B), and the calculated result was deemed as the survival rate. The results obtained are graphically shown in FIG. 8(A).

Then, with respect to each of the sample groups each comprising the 100 solar cell samples (B), 10 solar cell samples which exhibited a shunt resistance of 1 kΩ per cm² or above were selected, and they were subjected to measurement of short-circuit current (Jsc) by means of a solar cell simulator wherein pseudo sun light of AM 1.5 with an intensity of 100 mW was irradiated at a temperature of 25° C. The mean value of Jsc was obtained with respect to each of the solar cell sample groups each comprising the selected 10 solar cell samples. The results obtained are graphically shown in FIG. 8(B).

Further, with respect to each of the sample groups each comprising the 100 solar cell samples (B), the selected 10 solar cell samples were subjected to measurement of open-circuit voltage (Voc) by means of a conventional method. The mean value of Voc was obtained with respect to each of the solar cell sample groups each comprising the selected 10 solar cell samples. There was then obtained a fill factor (FF) based on the foregoing mean value of Jsc and the resultant mean value of Voc with respect to each of the sample groups each comprising the selected 10 solar cell samples. The results obtained are graphically shown in FIG. 8(B).

The plotted values of each of Jsc and FF in FIG. 8(B) are relative to those values of each of Jsc and FF obtained for the comparative solar cell samples prepared by repeating the above procedures except for not carrying out the step of forming the Cu film, wherein each of the latter values was set at 1 in each case.

From the results shown in FIGS. 8(A) and (B), the following were found: (i) when the thickness of the Cu film as the highly reflective thin layer exceeds 150 nm, the survival rate is suddenly and sharply reduced. The reason for this is considered that the constituent Cu atoms of the highly reflective thin layer diffuse into the active semiconductor layer thereby causing shunts between the opposite electrodes when the thickness of the Cu film as the highly reflective thin layer is increased beyond 150 nm; (ii) when the thickness of the Cu film as the highly reflective thin layer is less than 10 nm, the value of Jsc is markedly reduced (the reason for this is considered that a sufficient reflectivity is not provided when the thickness of the Cu film as the highly reflective thin layer is less than 10 nm); and (iii) the value of FF (fill factor) noticeably decreases as the thickness of the Cu film as the highly reflective thin layer increases to beyond 150 nm. The reason for this is considered that the constituent Cu atoms of the highly reflective thin layer diffuse into the semiconductor active layer, thereby causing negative influences.

In consequence, it was found that in a solar cell provided with the foregoing base member comprising a substrate having a flat surface, a specific light scattering layer 102 having a roughened surface provided with irregularities of 0.8 μm in maximum difference of elevation (Rmax) disposed on the flat surface of the substrate and with a specific highly reflective thin layer 103 comprising a Cu thin film of a thickness in the range of 10 nm to 150 nm laminated on the roughened surface of said light scattering layer provides improved solar cell characteristics, particularly stable output of an improved short-circuit current (Jsc), thereby providing an improved photoelectric conversion efficiency; and said solar cell can be mass-produced at an improved yield (i.e. improved survival rate).

Example 2

There were prepared a plurality of base member samples 100 by repeating the procedures of Example 1 for the preparation of the base member sample 100, except that the Cu source was replaced by an Ag source to form an Ag thin film as the highly reflective thin layer 102.

Using these base member samples 100, there were prepared a plurality of single pin junction a-SiGe solar cell samples by repeating the procedures of Example 1.

The resultant single pin junction a-SiGe solar cell samples were evaluated in the same manner as in Example 1.

There were obtained results with respect to the survival rate as shown in FIG. 9(A) and with respect to Jsc and FF as shown in FIG. 9(B).

It was found that the results obtained in this example were quite similar to those obtained in Example 1 except for the following distinction.

That is, it was found that the tendency for a reduction in the survival rate and FF value when the highly reflective thin layer 103 is thickened beyond 150 nm is rather gentle in the case where said highly reflective thin layer is comprised of the Cu film in comparison with the case where said highly reflective thin layer is comprised of Ag film. As for the reason for this, it is considered that negative influences caused as a result of diffusion of a certain amount of Cu into the semiconductor layer are smaller than those caused as a result of diffusion of a similar amount of Ag into the semiconductor layer.

In consequence, it was found that a solar cell provided with the base member comprising a substrate having a flat surface, a light scattering layer 102 having a roughened surface provided with irregularities of 0.8 μm in maximum difference of elevation (Rmax) being disposed on the flat surface of the substrate and a highly reflective thin layer 103 comprising an Ag thin film of a thickness in the range of 10 nm to 150 nm laminated on the roughened surface of said light scattering layer provides improved solar cell characteristics. Particularly, it stably outputs an improved short-circuit current (Jsc), thereby providing an improved photoelectric conversion efficiency; and said solar cell can be mass-produced at an improved yield (i.e. improved survival rate).

EXAMPLES 3 TO 6 AND COMPARATIVE EXAMPLES 1 TO 5

Example 3

In this example, there were prepared 20 single pin junction solar cells of the configuration shown in FIG. 10, each provided with the base member 100 shown in FIG. 7, under the conditions shown in Table 1.

There were provided 20 well-cleaned SUS 304 stainless steel plates of 10 cm × 10 cm is size and 0.5 mm in thickness and having a flat surface provided with irregularities of less than 0.1 μm in maximum difference of elevation (Rmax) as the substrate 101.

On each of the stainless steel substrates there was deposited an Al-Si film of 500 nm in mean thickness as the light scattering layer 102 by means of a conventional sputtering method, wherein a target comprising a metallic material composed of Al containing Si in an amount of 5 atomic % was sputtered in Ar gas while maintaining the stainless steel substrate at a temperature of 380° C. The Al-Si film was found to have a roughened surface provided with irregularities of 0.8 μm in maximum difference of elevation (Rmax). Next, on the roughened surface of the Al-Si film as the light scattering layer 102 there was deposited a 50 nm thick Cu thin film as the highly reflective thin layer 103 by means of a conventional sputtering method while ensuring that the irregularities formed at the surface of the Al-Si film were not deformed, wherein a Cu-target was sputtered in Ar gas while maintaining the substrate at 50° C. Then, on the Cu film as the highly reflective thin layer 103 there was deposited a 200 nm thick ZnO film as the transparent and conductive layer 104 by a conventional sputtering method, wherein a target comprising ZnO was sputtered in Ar gas while maintaining the substrate at room temperature.

Thus, there were obtained 20 base member samples of the configuration shown in FIG. 7, each comprising an Al-Si film of 500 nm in mean thickness having a roughened surface provided with irregularities of 0.8 μm in maximum difference of elevation as the light scattering layer 102, a 50 nm thick Cu thin film as the highly reflective thin layer 103, and a 200 nm thick ZnO film as the transparent and conductive layer 104 disposed in this order on a flat surface of less than 0.1 μm in maximum difference of elevation (Rmax) of a stainless steel plate as the substrate 101.

Figure 11:
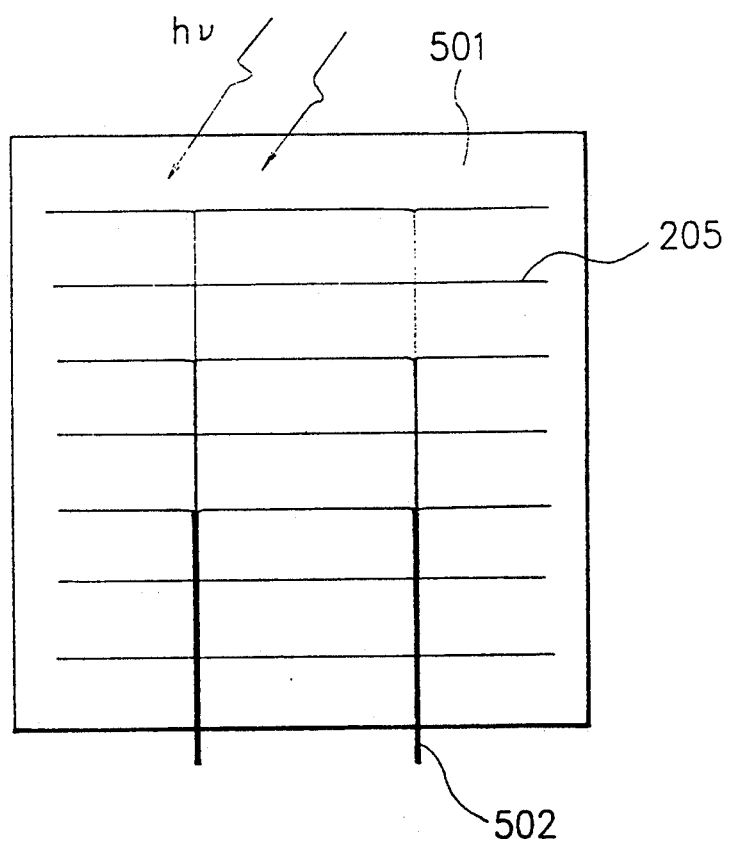
FIG. 11 is a schematic view illustrating the configuration of the side of the solar cells shown in FIGS. 10, 12, and 13 through which light is impinged.

On the ZnO film 104 of each of the 20 base member samples there were next formed in succession a 20 nm thick n-type amorphous silicon semiconductor film (a:-Si:H:P film) as the n-type semiconductor layer 201, a 250 thick i-type amorphous silicon germanium semiconductor film (a:SiGe:H film) as the i-type semiconductor layer 202, and a 50 nm thick p-type microcrystal silicon semiconductor film (μc-Si:H:B film) as the p-type semiconductor layer 203 by means of a conventional plasma CVD method under the film-forming conditions shown in Table 1. Next, there was formed a 70 nm thick ITO film as the transparent and conductive layer 204 (upper electrode) by means of a conventional evaporation method, wherein a source comprising ITO was evaporated in $O_2$ gas while maintaining the substrate at a temperature of 170° C. Finally, on the ITO film there was formed an Al film in such a pattern as shown in FIG. 11 as the collecting electrode 205 by means of a conventional electron beam evaporation method. Thus, there were obtained 20 single pin junction a-SiGe solar cells each of 10 cm×10 cm in size. The i-type a-SiGe film of each of the resultant a-SiGe solar cells was found to have an optical band gap (Eg) of 1.48 eV.

Example 4

The procedures of Example 3 were repeated, except that the thickness of the Cu film as the highly reflective thin layer 103 was changed to 20 nm, to thereby prepare 20 single pin junction a SiGe solar cells each of 10 cm×10 cm in size.

Example 5

The procedures of Example 3 were repeated, except that the thickness of the Cu film as the highly reflective thin layer 103 was changed to 100 nm, to thereby prepare 20 single pin junction a-SiGe solar cells each of 10 cm×10 cm in size.

Example 6

The procedures of Example 3 were repeated, except that a 50 nm thick Ag film was formed by a conventional electron beam evaporation method as the highly reflective thin layer 103, to thereby prepare 20 single pin junction a-SiGe solar cells each of 10 cm×10 cm in size.

Comparative Example 1

The procedures of Example 3 were repeated, except that the step of forming the highly reflective thin layer 103 was not carried out, to thereby prepare 20 comparative single pin junction a-SiGe solar cells each of 10 cm×10 cm in size.

Comparative Example 2

The procedures of Example 3 were repeated, except that a 50 nm thick Al film was formed by a conventional electron beam evaporation method as the highly reflective thin layer 103, to thereby prepare 20 comparative single pin junction a-SiGe solar cells each of 10 cm×10 cm in size.

Comparative Example 3

The procedures of Example 3 were repeated, except that as the light scattering layer 102 an Ag film of 500 nm in mean thickness and having a roughened surface provided with irregularities of 0.8 μm in maximum difference of elevation (Rmax) was formed by a conventional sputtering method wherein an Ag target was sputtered in Ar gas while maintaining the substrate at a temperature of 350° C., to thereby prepare 20 comparative single pin junction a-SiGe solar cells each of 10 cm×10 cm in size.

Comparative Example 4

The procedures of Example 3 were repeated, except that the thickness of the Cu film as the highly reflective thin layer 103 was changed to 5 nm, to thereby prepare 20 comparative single pin junction a-SiGe solar cells each of 10 cm×10 cm in size.

Comparative Example 5

The procedures of Example 3 were repeated, except that the thickness of the Cu film as the highly reflective thin layer 103 was changed to 300 nm, to thereby prepare 20 comparative single pin junction a-SiGe solar cells each of 10 cm×10 cm in size.

EVALUATION

The 20 single pin junction a-SiGe solar cells obtained in each of Examples 3 to 6 and the 20 comparative single pin junction a-SiGe solar cells obtained in each of Comparative Examples 1 to 5 were subjected to measurement of shunt resistance in the dark by means of a conventional method. From the results obtained, the proportion of the solar cells which exhibited a shunt resistance of at least 1 kΩ per 1 cm² was calculated in each case, and the calculated result was deemed as the survival rate.

Then, the 20 single pin junction a-SiGe solar cells obtained in each of Examples 3 to 6 and the 20 comparative single pin junction a-SiGe solar cells obtained in each of Comparative Examples 1 to 5 were subjected to measurement of short circuit current (Jsc) by means of a solar cell simulator wherein pseudo sun light of AM 1.5 with an intensity of 100 mW was irradiated at a temperature of 25° C., and the mean value of Jsc was obtained in each case.

Further, the 20 single pin junction a-SiGe solar cells obtained in each of Examples 3 to 6 and the 20 comparative single pin junction a-SiGe solar cells obtained in each of Comparative Examples 1 to 5 were subjected to measurement of open-circuit voltage (Voc) by means of a conventional Voc-measuring method, and the mean value of Voc was obtained in each case.

And in each case, there was obtained a fill factor (FF) in terms of mean value and a photoelectric conversion efficiency (η) in terms of mean value based on the resultant mean values of Jsc and Voc.

The results obtained in the above with respect to the 20 single pin junction a-SiGe solar cells obtained in each of Examples 3 to 6 are collectively given in Table 2, in which the results of each of the mean value of Jsc, the mean value of FF and the mean value of η with respect to the 20 pin single junction a-SiGe solar cells obtained in each of Examples 3 to 6 are relative to those of the 20 comparative single pin junction a-SiGe solar cells with no thin layer obtained in Comparative Example 1, which were each set at a value of 1.

The results obtained in the above with respect to the 20 comparative single pin junction a-SiGe solar cells obtained in each of Comparative Examples 1 to 5 are collectively shown in Table 3, in which the mean values of Jsc, FF, and η are relative to those with respect to the 20 comparative single pin junction a-SiGe solar cells obtained in Comparative Example 1, which were set at a value of 1.

From the results shown in Tables 2 and 3, the following was found. That is, (i) each of the solar cells obtained in Examples 3 to 6 of the present invention each provided with the base member 100 according to the present invention provides improved solar cell characteristics, particularly stable output of an improved short-circuit current (Jsc) providing an improved photoelectric conversion efficiency, and mass-producibility at an improved yield (i.e. improved survival); and (ii) each of the comparative solar cells obtained in Comparative Examples 2 to 5 is similar to the comparative solar cell obtained in Comparative Example 1 with no thin layer and is distinguishably inferior to the solar cells according to the present invention especially with respect to the survival rate, the value of Jsc, and the photoelectric conversion efficiency of η, which are the most important factors for the production of a solar cell.

Particularly, each of the 20 comparative single pin junction a-SiGe solar cells with no thin layer obtained in Comparative Example 1 is markedly poor, especially with respect to the survival rate. The reason for this is considered that the constituent Al atoms of the Al-Si film as the light scattering layer migrated and diffused into the semiconductor active layer. As for the 20 comparative single pin junction a-SiGe solar cells obtained in Comparative Example 2, their survival rate is worse than that of the 20 comparative single pin junction a-SiGe solar cells obtained in Comparative Example 1. The reason for this is considered that the Al of the Al film as the thin layer substantially diffused into the semiconductor active layer. As for the 20 single pin junction a-SiGe solar cells with no thin layer obtained in Comparative Example 3, their survival rate is better than that of the 20 comparative single pin junction a-SiGe solar cells obtained in Comparative Example 1 but is still poor. The reason for this is considered that Ag atoms of the relatively thick (500 nm) Ag film as the light scattering layer diffused into the semiconductor active layer. As for the 20 single pin junction a-SiGe solar cells provided with the highly reflective thin layer comprising a thin Cu film obtained in Comparative Example 4, their survival rate is satisfactory but their Jsc value is almost the same as that of the 20 comparative single pin junction a-SiGe solar cells obtained in Comparative Example 1. The reason for this is considered that sufficient reflectivity was not provided because of the excessively thin Cu film as the highly reflective thin layer. As for the 20 single pin junction a-SiGe solar cells provided with the highly reflective thin layer comprising a thick Cu film obtained in Comparative Example 5, their survival rate is not satisfactory. The reason for this is considered that substantial diffusion of Cu atoms of the Cu film as the highly reflective thin layer was caused because of the excessively thick Cu film.

EXAMPLE 7 AND COMPARATIVE EXAMPLE 6

In this example, there were prepared a plurality of single pin junction solar cells of the tandem type configuration shown in FIG. 12, each provided with the base member 100 shown in FIG. 7, under the conditions shown in Table 4.

There was first provided a polyimide web of 0.2 mm in thickness, 32 cm in width and 50 m in length and having a well-cleaned and flat surface provided with irregularities of less than 0.1 μm in maximum difference of elevation (Rmax) as the substrate 101.

On the flat surface of the substrate web 101 there were next deposited the respective films in a conventional continuous film-forming manner by means of a so-called roll-to-roll film-forming system wherein a substrate web wound on a pay-out roll is continuously delivered into a film-forming chamber wherein a film is deposited on the surface of the substrate web and the substrate web on which the film has been deposited is taken up by a take-up roll.

In particular, on the well-cleaned and flat surface of the polyimide substrate web 101 there was deposited a Cu-Si film of 800 nm in mean thickness as the light scattering layer 102 by means of a conventional sputtering method, wherein a target comprising a metallic material composed of Cu containing Si in an amount of 5 wt. % was sputtered in Ar gas while maintaining the polyimide substrate 101 at a temperature of 200° C. The Al-Si film as the light scattering layer 102 formed on the polyimide substrate web in this case was found to have a roughened surface provided with irregularities of 0.7 μm in maximum difference of elevation (Rmax). Successively, on the roughened surface of the Cu-Si film as the light scattering layer 102 there was deposited a 50 nm thick Ag thin film as the highly reflective thin layer 103 by means of a conventional electron beam evaporation method while ensuring that the irregularities formed at the surface of the Cu-Si film were not deformed, wherein an Ag source was evaporated while maintaining the polyimide substrate 101 at 50° C. Then, on the Ag film as the highly reflective thin layer 103 there was deposited a 200 nm thick TiO₂ film as the transparent and conductive layer 104 by a conventional sputtering method, wherein a target comprising TiO₂ was sputtered while maintaining the polyimide substrate at 200° C.

Thus, there was obtained a base member sample of the configuration shown in FIG. 7, comprising a Cu-Si film of 800 nm in mean thickness having a roughened surface provided with irregularities of 0.7 um in maximum difference of elevation (Rmax) as the light scattering layer 102, a 50 nm thick Ag thin film as the highly reflective thin layer 103 and a 200 nm thick TiO₂ film as the transparent and conductive layer 104, disposed in this order on the flat surface of less than 0.1 μm in maximum difference of elevation (Rmax) of the polyimide substrate web 101.

On the TiO₂ film as the transparent and conductive layer 104 of the base member there were then formed a first pin junction cell and then a second pin junction cell by a conventional plasma CVD method under the film-forming conditions shown in Table 4. That is, in the formation of the first pin junction cell, there were successively formed a 20 nm thick n-type amorphous silicon semiconductor film (a-Si:H:P film) as the n-type semiconductor layer 301 by using SiH₄ gas, PH₃ gas, and H₂ gas and maintaining the substrate 101 at 300° C., a 250 nm thick i-type amorphous silicon germanium semiconductor film (a-SiGe:H film) as the i-type semiconductor layer 302 by using SiH₄ gas, GeH₄ gas, and H₂ gas and maintaining the substrate 101 at 280° C., and a 5 nm thick p-type microcrystal silicon semiconductor film (μc.Si:H:B film) as the p-type semiconductor layer 303 by using SiH₄ gas, B₂H₆ gas, and H₂ gas and maintaining the substrate 101 at 260° C., wherein the i-type semiconductor layer 302 was formed to have a graded band gap region at each of the opposite sides thereof by gradually increasing the flow rate of the GeH₄ gas from zero until a predetermined flow rate, maintaining said flow rate for a predetermined period of time and then gradually decreasing the flow rate to zero while maintaining the total flow rate of the gases. The optical band gap (Eg) of the center of the resultant a-SiGe film as the i-type semiconductor layer 302 was found to be 1.48 eV. In the formation of the second pin junction cell, there were successively formed a 20 nm thick n-type amorphous silicon semiconductor film (a-Si:H:P film) as the n-type semiconductor layer 304 by using SiH₄ gas, PH₃ gas, and H₂ gas and maintaining the substrate 101 at 240° C., a 200 nm thick i-type amorphous silicon semiconductor film (a-Si:H film) as the i-type semiconductor layer 305 by using SiH₄ gas and H₂ gas and maintaining the substrate 101 at 240° C., and 4 nm thick p-type microcrystal silicon semiconductor film (μc.Si:H:B film) as the p-type semiconductor layer 306 by using SiH₄ gas, B₂H₆ gas, and H₂ gas and maintaining the substrate 101 at 200° C. Then, on the p-type semiconductor layer 306 of the second pin junction cell there was formed a 70 nm thick ITO film as the transparent and conductive layer 204 (upper electrode) by a conventional heat resistance evaporation method, wherein a source comprising ITO was evaporated while maintaining the substrate 101 at a temperature of 170° C. Finally, on the ITO film there was formed an Al film in such a pattern as shown in FIG. 11 as the collecting electrode 205 by a conventional electron beam evaporation method. Thus, there was obtained a tandem type solar cell.

The resultant tandem type cell was scribed and cut to provide 300 square portions respectively of 10 cm × 10 cm in size by means of conventional techniques to form 300 tandem type solar cell samples each of 10 cm × 10 cm in size.

Comparative Example 6

The procedures of Example 7 were repeated, except that the step of forming an Ag thin film as the highly reflective thin layer 103 was not carried out and the thickness of the a-Si:H film as the i-type semiconductor layer 305 was changed to 1800 nm, to thereby form 300 tandem type pin junction solar cells each of 10 cm × 10 cm in size.

EVALUATION

The 300 tandem type pin junction solar cells obtained in Example 7 and the 300 comparative tandem type pin junction solar cells obtained in Comparative Example 6 were subjected to measurement of shunt resistance in the dark by means of a conventional method. From the results obtained, the proportion of the solar cells which exhibited a shunt resistance of at least 1 kΩ per 1 cm² was calculated in each case, and the calculated result was deemed as the survival rate.

Then, the 300 tandem type pin junction solar cells obtained in Example 7 and the 300 comparative tandem type pin junction solar cells obtained in Comparative Example 6 were subjected to measurement of short-circuit current (Jsc) by means of a solar cell simulator wherein pseudo sun light of AM 1.5 with an intensity of 100 mW was irradiated at a temperature of 25° C., and the mean value of Jsc was obtained in each case.

Further, the 300 tandem type pin junction solar cells obtained in Example 7 and the 300 comparative tandem type pin junction solar cells obtained in Comparative Example 6 were subjected to measurement of open-circuit voltage (Voc) by a conventional Voc-measuring method, and the mean value of Voc was obtained in each case.

And in each case, there was obtained a fill factor (FF) in terms of mean value and a photoelectric conversion efficiency ($\eta$) in terms of means value base on the resultant mean values of Jsc and Voc.

The results obtained in the above with respect to the 300 tandem type in junction solar cells obtained in Example 7 and the 300 comparative tandem type pin junction solar cells obtained in Comparative Example 6 are collectively shown in Table 5, in which the mean values of Jsc, FF, and $\eta$ of the 300 tandem type pin junction solar cells obtained in Example 7 are relative to those of the 300 comparative tandem type pin junction solar cells obtained in Comparative Example 6, which are set at a value of 1.

From the results shown in table 5, the following was found. That is, (i) each of the tandem type solar cells obtained in Example 5 of the present invention respectively provided with the base member 100 according to the present invention provides improved solar cell characteristics, particularly stable output of an improved short-circuit current (Jsc) thereby providing an improved photoelectric conversion efficiency, and it can be mass-produced at an improved yield (i.e. improved survival rate); and (ii) each of the tandem type solar cells obtained in Example 5 of the present invention respectively provided with the base member 100 according to the present invention surpasses each of the comparative tandem type solar cells obtained in Comparative Example 1 with no thin layer, especially with respect to the survival rate, the value of Jsc, and the photoelectric conversion efficiency, which are the most important factors for the production of a solar cell.

EXAMPLE 8 AND COMPARATIVE EXAMPLE 7

Example 8

In this example, there were prepared 20 single pn junction CdS/CdTe solar cells of the configuration shown in FIG. 13, each provided with the base member 100 shown in FIG. 7, under the conditions shown in Table 6.

There were first provided 20 well-cleaned alkali-free glass plates each 10 cm × 10 cm in size and 1.5 mm in thickness and having a flat surface provided with irregularities of less than 0.1 μm in maximum difference of elevation (Rmax) as the substrate 101.

On the surface of each of the glass substrates 101 there was deposited a stainless steel film of 1000 nm in mean thickness as the light scattering layer 102 by means of a conventional sputtering method, wherein a target comprising a stainless steel was sputtered in Ar gas while maintaining the glass substrate 101 at room temperature. The resultant was then subjected to a wet-etching treatment to establish irregularities of 0.8 μm in maximum difference of elevation (Rmax) at the surface of the stainless steel film 102 formed on the glass substrate 101. Successively, on the roughened surface of the stainless steel film as the light scattering layer 102 there was deposited a 50 nm thick Ag thin film as the highly reflective thin layer 103 by means of a conventional sputtering method while ensuring that the irregularities formed at the surface of the stainless film were not deformed, wherein an Ag-target was sputtered in Ar gas while maintaining the substrate at 50° C. Then, on the Ag film as the highly reflective thin layer 103 there was deposited a 200 nm thick $SnO_2$ film as the transparent and conductive layer 104 by a conventional sputtering method, wherein a target comprising $SnO_2$ was sputtered in Ar gas while maintaining the substrate at a temperature of 150° C.

Thus, there were obtained 20 base member samples of the configuration shown in FIG. 7, respectively comprising a stainless film of 1000 nm in mean thickness having a roughened surface provided with irregularities of 0.8 µm in maximum difference of elevation (Rmax) as the light scattering layer 102, a 50 nm thick Ag thin film as the highly reflective thin layer 103, and a 200 nm thick $SnO_2$ film as the transparent and conductive layer 104 disposed in this order on the flat surface of less than 0.1 µm in maximum difference of elevation (Rmax) of an alkali-free glass plate as the substrate 101.

On the $SnO_2$ film as the transparent and conductive layer 104 of each of the 20 base member samples there were then successively formed a 350 nm thick p-type CdTe semiconductor film as the p-type semiconductor layer 401 and a 100 nm thick n-type CdS semiconductor film as the n-type semiconductor layer 402 by means of a conventional evaporation method under the film-forming conditions shown in Table 6. Next, there was formed a 70 nm thick ITO film as the transparent and conductive layer 204 (upper electrode) by means of a conventional resistance heat evaporation method, wherein a source comprising ITO was evaporated in $O_2$ gas while maintaining the substrate at a temperature of 170° C. Finally, on the ITO film there was formed an Ag film in such a pattern as shown in FIG. 11 as the collecting electrode 205 by applying an Ag-paste in accordance with a screen-printing technique, followed by heat treatment at 150° C. in $N_2$ gas atmosphere for an hour. Thus, there were obtained 20 single pn junction CdS/CdTe solar cells each 10 cm×10 cm in size.

Comparative Example 7

The procedures of Example 8 were repeated, except that the step of forming the Ag thin film as the highly reflective thin layer 103 was not carried out, to thereby obtain 20 comparative single pn junction CdS/CdTe solar cells.

EVALUATION

The 20 single pn junction CdS/CdTe solar cells obtained in Example 8 and the 20 comparative single pn junction CdS/CdTe solar cells obtained in Comparative Example 7 were subjected to measurement of shunt resistance in the dark by means of a conventional method. From the results obtained, the proportion of the solar cells which exhibited a shunt resistance of at least 1 kΩ per 1 $cm^2$ was calculated in each case, and the calculated result was deemed as the survival rate.

Then, the 20 single pn junction Cds/CdTe solar cells obtained in Example 8 and the 20 comparative single pn junction CdS/CdTe solar cells obtained in Comparative Example 7 were subjected to measurement of short-circuit current (Jsc) by means of a solar cell simulator wherein pseudo sun light of AM 1.5 with an intensity of 100 mW was irradiated at a temperature of 25° C., and the mean value of Jsc was obtained in each case.

Further, the 20 single pin junction CdS/CdTe solar cells obtained in Example 8 and the 20 comparative single pn junction CdS/CdTe solar cells obtained in Comparative Example 7 were subjected to measurement of open-circuit voltage (Voc) by a conventional Voc-measuring method, and the mean value of Voc was obtained in each case.

And in each case, there was obtained a fill factor (FF) in terms of mean values and a photoelectric conversion efficiency ($\eta$) in terms of mean values based on the resultant values of Jsc and Voc.

The results obtained in the above with respect to the 20 single pn junction CdS/CdTe solar cells obtained in Example 8 and the 20 comparative single pn junction CdS/CdTe solar cells obtained in Comparative Example 7 are collectively shown in Table 7, in which the survival rate, the mean values of Jsc, FF, and $\eta$ of the 20 single pn junction CdS/CdTe solar cells obtained in Example 8 are shown relative to those of the 20 comparative single pn junction solar cells obtained in Comparative Example 7, which were set at a value of 1.

From the results shown in Table 7, the following was found. That is, (i) each of the 20 single pn junction CdS/CdTe solar cells obtained in Example 8 of the present invention provided with the base member 100 according to the present invention provides improved solar cell characteristics, particularly stable output of an increased short-circuit current (Jsc), thereby providing an improved photoelectric conversion efficiency, and mass-producibility at an improved yield (improved survival rate); and (ii) each of the 20 single pn junction CdS/CdTe solar cells obtained in Example 8 provided with the base member 100 according to the present invention surpasses each of the 20 comparative signal pn junction CdS/CdTe solar cells with no thin layer obtained in Comparative Example 7, especially with respect to the survival rate, the value of Jsc, and the photoelectric conversion efficiency, which are the most important factors for the production of a solar cell.

EXAMPLE 9 AND COMPARATIVE EXAMPLE 8

Example 9

There were prepared a plurality of single pin junction a-SiGe solar cells of the configuration shown in FIG. 10, each provided with the base member 100 shown in FIG. 7 without having the transparent and conductive layer 104, under the conditions shown in Table 8.

First, there was provided a plurality of well-cleaned SUS 304 stainless steel plates having a flat surface provided with irregularities of less than 0.05 µm in maximum difference of elevation (Rmax) as the substrate 101.

On each of the stainless steel substrates there was deposited an Al-Si film of a different mean thickness in the range of 100 nm to 3000 nm as the light scattering layer 102 by mean of a conventional sputtering method, wherein a target comprising a metallic material composed of Al containing Si in an amount of 5 wt. % was sputtered in Ar gas while maintaining the stainless steel substrate at a temperature of 350° C. and controlling the film formation period.

Thus, there were obtained a plurality of samples each comprising the stainless steel substrate 101 and the light scattering layer 102 formed of an Al-Si film of different means thicknesses having a roughened surface provided with irregularities of a maximum difference of elevation (Rmax). For each of the samples obtained, the maximum difference of elevation (Rmax) of the irregularities formed at the surface thereof was observed by a conventional method. Of these samples, those samples provided with irregularities of 0.2 μm, 1.0 μm, 2.0 μm, and 2.1 μm in maximum difference of elevation (Rmax) were selected.

For each of the samples thus selected, on the roughened surface of the Al-Si film as the light scattering layer 102 there was then deposited a Cu thin film of a different thickness in the range of 5 nm to 500 nm as the highly reflective thin layer 103 by means of a conventional sputtering method while ensuring that the irregularities formed at the surface of the Al-Si film were not deformed, wherein a Cu-target was sputtered in Ar gas while maintaining the substrate at a temperature of 50° C. and controlling the film formation period.

The maximum difference of elevation (Rmax) of the irregularities formed at the surface of the Cu film as the highly reflective thin layer 103 was observed in each case. As a result, it was found that the irregularities formed at the surface of the Cu film as the light scattering layer 102 were substantially equivalent to those formed on the surface of the Al-Si film as the light scattering layer 102 in each case.

Thus, there were obtained a plurality of base member samples 100 each comprising an Al-Si film of a different mean thickness in the range of 100 nm to 3000 nm having a roughened surface provided with irregularities of 0.2 μm, 1.0 μn, 2.0 μm, or 2.1 μm in maximum difference of elevation (Rmax) as the light scattering layer 102 and a Cu thin film of a different mean thickness of 5 nm to 500 nm as the highly reflective thin layer 103 disposed in this order on the flat surface of less than 0.05 μm in maximum difference of elevation (Rmax) of a stainless steel plate as the substrate 101.

On the Cu thin film as the highly reflective thin layer 103 of each of said plurality of base member samples there were then formed in succession an n-type amorphous silicon semiconductor film (a-Si:H:P film) as the n-type semiconductor layer 201, an i-type amorphous silicon germanium semiconductor film (a-SiGe:H film) as the i-type semiconductor layer 202, and a p-type microcrystal silicon semiconductor film (μc.Si:H:B film) as the p-type semiconductor layer 203 by means of a conventional plasma CVD method under the film-forming conditions shown in Table 8. Next, there was formed a 65 nm thick ITO film as the transparent and conductive layer 204 (i.e. upper electrode) by means of a conventional evaporation method, wherein a source comprising ITO was evaporated in $O_2$ gas while maintaining the substrate at a temperature of 160° C. Finally, on the ITO film there was formed an Al film as the collecting electrode by means of a conventional evaporation method. Thus, there were obtained a plurality of single pin junction a-SiGe solar cell samples (A).

Each of the resultant a-SiGe solar cell samples (A) was cut into 100 solar cell samples (B) each of 1 cm × 1 cm in size.

The 100 solar cell samples (B) obtained from each of the single pin junction a-SiGe solar cell samples (A) were subjected to measurement of shunt resistance in the dark by means of a conventional method. From the results obtained, the proportion of the solar cell samples (B) which exhibited a shunt resistance of at least 1 kΩ per 1 $cm^2$ was calculated with respect to each of the sample groups each comprising the 100 solar cell samples (B), and the calculated results was deemed as the survival rate. The results obtained are graphically shown in FIG. 14.

Then, with respect to each sample group comprising 100 solar cell samples (B), 10 solar cell samples which exhibited a shunt resistance of 1 kΩ per $cm^2$ or above were selected, and they were subjected to measurement of short-circuit current (Jsc) by means of a solar cell simulator wherein pseudo sun light of AM 1.5 with an intensity of 100 mW was irradiated at a temperature of 25° C. The mean value of Jsc was obtained with respect to each of the solar cell sample groups comprising the selected 10 solar cell samples. The results obtained are graphically shown in FIG. 15.

The plotted values of Jsc in FIG. 15 are values relative to those values of Jsc obtained for the comparative solar cell samples prepared in the following Comparative Example 8, wherein each of the latter values was set at 1 in each case.

Comparative Example 8

There were prepared a plurality of comparative single pin junction a-SiGe solar cells of the configuration shown in FIG. 10 without having the transparent and conductive layer 104, each having a Mo thin film as the layer 103.

First, there was provided a plurality of well-cleaned SUS 304 stainless steel plates having a flat surface provided with irregularities of less than 0.05 μm in maximum difference of elevation (Rmax) as the substrate 101.

On each of the stainless steel substrates there was deposited an Al-Si film of 800 nm in mean thickness as the light scattering layer 102 by mean of a conventional sputtering method, wherein a target comprising a metallic material composed of Al containing Si in an amount of 5 wt. % was sputtered in Ar gas while maintaining the stainless steel substrate at a temperature of 350° C.

Thus, there were obtained a plurality of samples each comprising the stainless steel substrate 101 and the light scattering layer 102 formed of the 800 nm thick Al-Si film having a roughened surface provided with irregularities of 1.0 μm in maximum difference of elevation (Rmax).

For each of the samples thus obtained, on the roughened surface of the Al-Si film as the light scattering layer 102 there was then deposited a Mo thin of a different thickness in the range of 5 nm to 500 nm as the reflective thin layer 103 by mean of a conventional sputtering method while ensuring that the irregularities formed at the surface of the Al-Si film were not deformed, wherein a Mo-target was sputtered in Ar gas while maintaining the substrate at a temperature of 50° C. and controlling the film formation period.

Thus, there were obtained a plurality of base member samples 100 each comprising an Al-Si film of 800 nm in mean thickness having a roughened surface provided with irregularities of 1.0 μm in maximum difference of elevation (Rmax) as the light scattering layer 102 and a Mo thin film of a different mean thickness of 5 nm to 500 nm as the reflective thin layer 103 disposed in this order on the flat surface of less than 0.05 μm in maximum difference of elevation (Rmax) of a stainless steel plate as the substrate 101.

On the Mo thin film as the reflective thin layer 103 of each of said plurality of base member samples there were successively formed a semiconductor film (a-Si:H:P film) as the n-type semiconductor layer 201, an i-type amorphous silicon germanium semiconductor film (a-SiGe:H film) as the i-type semiconductor layer 202, and a p-type microcrystalline silicon semiconductor film (μc.Si:H:B film) as the p-type semiconductor layer 203 in the same manner as in Example 9. Next, there was formed a 65 nm thick ITO film as the transparent and conductive layer 204 (upper electrode) in the same manner as in Example 9. Finally, on the ITO film there was formed an Al film as the collecting electrode by means of a conventional evaporation method. Thus, there were obtained a plurality of comparative single injunction a-SiGe solar cell samples (A').

Each of the resultant a-SiGe solar cell samples (A') was cut into 100 solar cell samples (B') each of 1 cm×1 cm in size.

The 100 solar cell samples (B') obtained from each of the single pin junction a-SiGe solar cell samples (A') were subjected to measurement of shunt resistance in the dark by means of a conventional method. From the results obtained, the proportion of the solar cell samples (B') which exhibited a shunt resistance of at least 1 kΩ per 1 cm$^2$ was calculated with respect to each of the sample groups each comprising the 100 solar cell samples (B'), and the calculated result was deemed as the survival rate. The results obtained are graphically shown in FIG. 14 by x—x line.

Then, with respect to each sample group comprising the 100 solar cell samples (B'), 10 solar cell samples which exhibited a shunt resistance of 1 kΩ per cm$^2$ or above were selected, and they were subjected to measurement of short-circuit current (Jsc) by means of a solar cell simulator wherein pseudo sun light of AM 1.5 with an intensity of 100 mW was irradiated at a temperature of 25° C. The mean value of Jsc was obtained with respect to each of the solar cell sample groups each comprising the selected 10 solar cell samples. The results obtained are graphically shown in FIG. 15 by x—x line.

Figure 14:
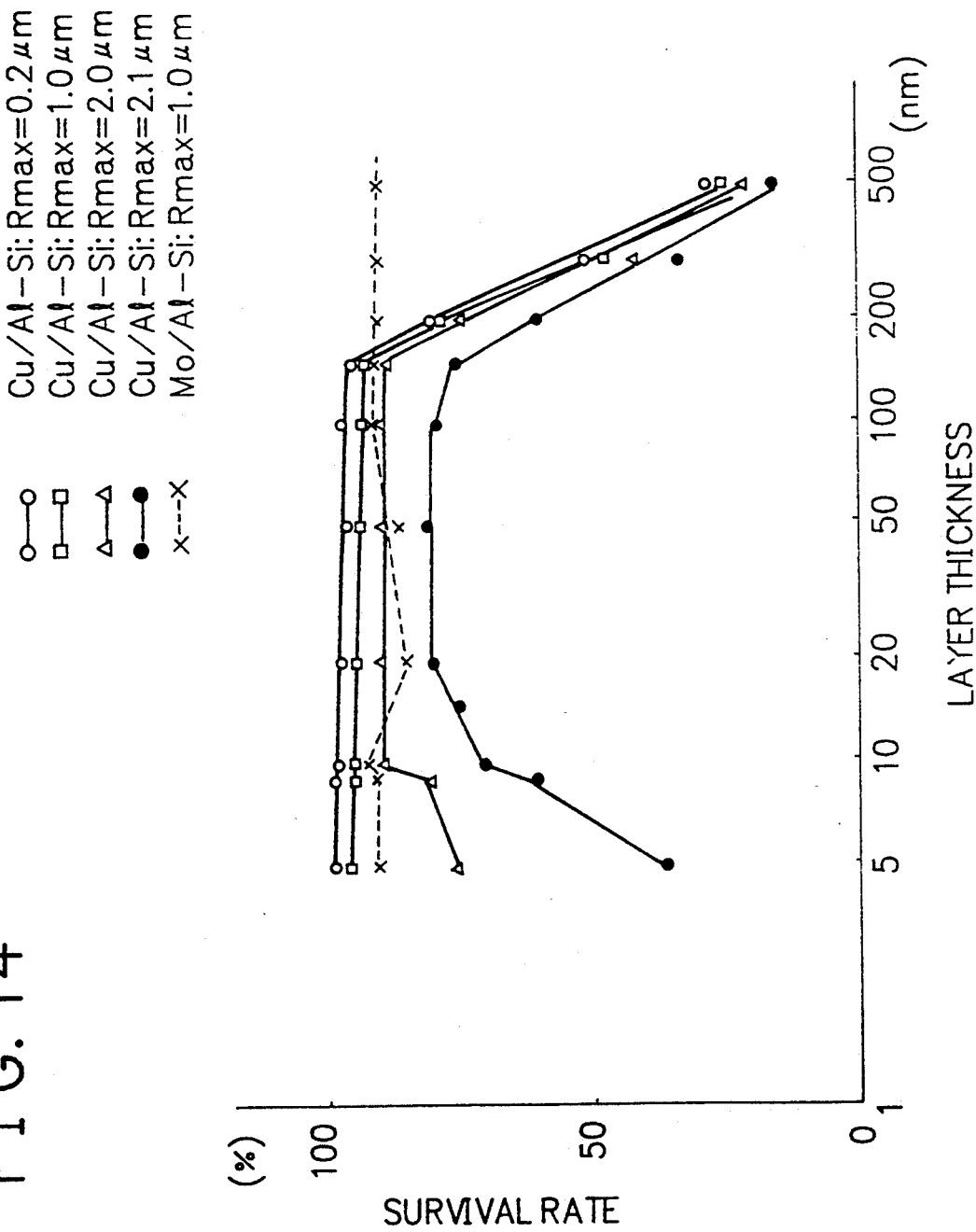
FIG. 14 is a graph showing the interrelation between the thickness of a highly reflective thin layer and the survival rate with respect to the solar cells obtained in Examples of the present invention (which will be later described) and the comparative solar cells obtained in Comparative Examples (which will be later described).

From the results shown in FIGS. 14 and 15, it is understood that the use of the base member 100 according to the present invention in which the highly reflective thin layer 103 is comprised of a highly reflective metal (Cu) film of 10 nm to 150 nm in mean thickness and having a roughened surface provided with irregularities of 0.2 to 2.0 μm in maximum difference of elevation (Rmax) at the surface thereof makes the resulting solar cells output an improved short-circuit current (Jsc) resulting in an improved photoelectric conversion efficiency and which can be mass-produced at an improved survival rate (i.e. improved yield).

TABLE 1

|  | constituent material | method for layer formation | layer thickness (nm) | substrate temperature (°C.) | gas used |
| --- | --- | --- | --- | --- | --- |
| upper electrode | ITO | evaporation method | 70 | 170 | — |
| p-type layer | μc-Si:H:B | plasma CVD method | 5 | 200 | SiH$_4$/B$_2$H$_6$/H$_2$ |
| i-type layer | a-SiGe:H | plasma CVD method | 250 | 280 | GeH$_4$/SiH$_4$/H$_2$ |
| n-type layer | a-Si:H:P | plasma CVD method | 20 | 300 | SiH$_4$/PH$_3$/H$_2$ |
| transparent and conductive film | ZnO | sputtering method | 200 | room temperature | — |
| thin layer | Cu | sputtering method | 50 | 50 | — |
| light scattering layer | Al—Si | sputtering method | 500 | 380 | — |
| substrate | stainless steel | — | 5 × 10$^5$ | — | — |

TABLE 2

|  | Example 3 | Example 4 | Example 5 | Example 6 | Comparative Example 1 |
| --- | --- | --- | --- | --- | --- |
| the metal of the light scattering layer | Al—Si | Al—Si | Al—Si | Al—Si | Al—Si |
| thickness of the thin layer (nm) | Cu 50 | Cu 20 | Cu 100 | Ag 50 | — 50 |
| survival rate (%) | 85 | 90 | 85 | 90 | 20 |
| Voc | 0.99 | 0.99 | 0.98 | 0.98 | 1 |
| Jsc | 1.15 | 1.13 | 1.16 | 1.16 | 1 |
| F F | 0.99 | 1.00 | 0.98 | 0.97 | 1 |
| η | 1.13 | 1.12 | 1.11 | 1.10 | 1 |

TABLE 3

|  | Comparative Example 1 | Comparative Example 2 | Comparative Example 3 | Comparative Example 4 | Comparative Example 5 |
| --- | --- | --- | --- | --- | --- |
| the metal of the light scattering layer | Al—Si | Al—Si | Ag | Al—Si | Al—Si |
| thickness of the thin layer (nm) | — | Al 50 | — | Cu 5 | Cu 300 |
| survival rate (%) | 25 | 20 | 40 | 80 | 55 |
| Voc | 1 | 0.95 | 0.95 | 0.99 | 0.97 |

TABLE 3-continued

|  | Comparative Example 1 | Comparative Example 2 | Comparative Example 3 | Comparative Example 4 | Comparative Example 5 |
|---|---|---|---|---|---|
| Jsc | 1 | 1.15 | 1.17 | 1.04 | 1.15 |
| F F | 1 | 0.95 | 0.95 | 1.00 | 0.97 |
| η | 1 | 1.04 | 1.06 | 1.03 | 1.08 |

TABLE 4

|  | constituent material | method for layer formation | layer thickness (nm) | substrate temperature (°C.) | gas used |
|---|---|---|---|---|---|
| upper electrode | ITO | evaporation method | 70 | 170 | — |
| p-type layer | μc-Si:H:B | plasma CVD method | 4 | 200 | $SiH_4/B_2H_6/H_2$ |
| i-type layer | a-Si:H | plasma CVD method | 220 | 240 | $SiH_4/H_2$ |
| n-type layer | a-Si:H:P | plasma CVD method | 20 | 240 | $SiH_4/PH_3/H_2$ |
| p-type layer | μc-Si:H:B | plasma CVD method | 5 | 260 | $SiH_4/B_2H_6/H_2$ |
| i-type layer | a-SiGe:H | plasma CVD method | 250 | 280 | $SiH_4/GeH_4/H_2$ |
| n-type layer | a-Si:H:P | plasma CVD method | 20 | 300 | $SiH_4/PH_3/H_2$ |
| transparent and conductive film | TiC | sputtering method | 200 | 200 | — |
| thin layer | Ag | evaporation method | 50 | 50 | — |
| light scattering layer | Cu—Si | sputtering method | 800 | 200 | — |
| substrate | polyimide | — | $2 \times 10^5$ | — | — |

TABLE 5

|  | Example 7 | Comparative Example 6 |
|---|---|---|
| the metal of the light scattering layer | Cu—Si | Cu—Si |
| thickness of the thin layer (nm) | Ag 50 | — |
| survival rate (%) | 88 | 20 |
| Voc | 0.99 | 1 |
| Jsc | 1.21 | 1 |
| F F | 0.96 | 1 |
| η | 1.15 | 1 |

TABLE 7

|  | Example 8 | Comparative Example 7 |
|---|---|---|
| the metal of the light scattering layer | S U S | S U S |
| thickness of the thin layer (nm) | Ag 50 | — |
| survival rate (%) | 90 | 85 |
| Voc | 0.98 | 1 |
| Jsc | 1.14 | 1 |
| F F | 0.97 | 1 |
| η | 1.08 | 1 |

TABLE 6

|  | constituent material | method for layer formation | layer thickness (nm) | substrate temperature (°C.) |
|---|---|---|---|---|
| upper electrode | ITO | evaporation method | 70 | 170 |
| n-type layer | CdS | evaporation method | 100 | 300 |
| p-type layer | CdTe | evaporation method | 350 | 350 |
| transparent and conductive film | SnO | sputtering method | 200 | 150 |
| thin layer | Ag | sputtering method | 50 | 50 |
| light scattering layer | stainless steel | sputtering method | 1000 | room temperature |
| substrate | glass | — | $1.5 \times 10^6$ | — |

TABLE 8

|  | constituent material | method for layer formation | layer thickness (nm) | substrate temperature (°C.) | gas used |
|---|---|---|---|---|---|
| upper electrode | ITO | evaporation method | 65 | 160 | $O_2$ |
| p-type layer | μc-Si:H:B | plasma CVD | 5 | 200 | $SiH_4/B_2H_6/H_2$ |

TABLE 8-continued

| | constituent material | method for layer formation | layer thickness (nm) | substrate temperature (°C.) | gas used |
|---|---|---|---|---|---|
| i-type layer | a-SiGe:H | plasma CVD method | 250 | 270 | $GeH_4/SiH_4/H_2$ |
| n-type layer | a-Si:H:P | plasma CVD method | 20 | 300 | $SiH_4/PH_3/H_2$ |
| thin layer | Cu | sputtering method | 5~500 | 50 | Ar |
| light scattering layer | Al—Si | sputtering method | 100~3000 | 350 | Ar |
| substrate | stainless steel | — | — | — | — |

What is claimed:

1. A solar cell comprising a substrate having a surface, a first conductive layer disposed on the surface of the substrate, said first conductive layer having a roughened surface provided with irregularities at the surface thereof, a second conductive layer disposed on the roughened surface of said first conductive layer, said second conductive layer having a roughened surface provided with irregularities, a semiconductor active layer disposed on the roughened surface of said second conductive layer and an upper conductive layer disposed on said semiconductor active layer, wherein said roughened surface of said first conductive layer is provided with irregularities of 0.2 μm to 2.0 μm in maximum difference of elevation, said second conductive layer is formed of a 10 nm to 150 nm thick film of a metal having a high reflectivity, and said first conductive layer is thicker than said second conductive layer.

2. A solar cell according to claim 1, wherein a transparent and conductive layer is interposed between the second conductive layer and the semiconductor active layer.

3. A solar cell according to claim 1, wherein the film of a metal having a high reflectivity is composed of a metal selected from the group consisting of Cu and Ag.

4. A solar cell according to claim 1, wherein the thickness of the second conductive layer is in the range of 20 nm to 150 nm.

5. A solar cell according to claim 1, wherein the first conductive layer is composed of an alloy containing at least one kind of the atoms contained in the second conductive layer.

6. A solar cell according to claim 5, wherein the alloy contains Cu atoms.

7. A solar cell according to claim 1, wherein the first conductive layer is composed on an alloy containing silicon atoms.

8. A solar cell according to claim 1, wherein the film of a metal having a high reflectivity of which the second conductive layer is formed is of at least 95% in reflectivity.

9. A solar cell comprising a substrate having a surface, a first conductive layer disposed on the surface of said substrate, said first conductive layer having a roughened surface provided with irregularities at the surface thereof, a second conductive layer disposed on the roughened surface of said first conductive layer, said second conductive layer having a roughened surface provided with irregularities, a semiconductor active layer disposed on the roughened surface of said second conductive layer and a transparent and conductive layer disposed on said semiconductor active layer, wherein said roughened surface of said first conductive layer is provided with irregularities of 0.2 μm to 2.0 μm in maximum difference of elevation, said second conductive layer is formed of a 10 nm to 150 nm thick film of a metal having a high reflectivity, said first conductive layer is thicker than said second conductive layer, and said semiconductor active layer comprises a silicon-containing non-single crystal semiconductor and is provided with one or more pin junctions.

10. A solar cell according to claim 9, wherein a transparent and conductive layer is interposed between the second conductive layer and the semi-conductor active layer.

11. A solar cell according to claim 10, wherein the semiconductor active layer comprises a non-single crystal silicon film containing phosphorous atoms, a non-single crystal silicon germanium film, and a non-single crystal silicon film containing boron atoms laminated in this order on the transparent and conductive layer.

12. A solar cell according to claim 11, wherein the non-single crystal silicon film containing boron atoms is microcrystalline.

13. A solar cell according to claim 9 which comprises two pin junction layers, one of said pin junction layers comprising a non-single crystal silicon film containing phosphorous atoms, a non-single crystal silicon germanium film, and a non-single crystal silicon film containing boron atoms laminated in this order from the side of substrate, and the other cell stacked on said one cell and comprising a non-single crystal silicon film containing phosphorous atoms, a non-single crystal silicon film, and a non-single crystal silicon film containing boron atoms laminated in this order from the side of substrate.

14. A solar cell according to claim 13, wherein the non-single crystal silicon film containing boron atoms of at least one of the two cells is microcrystalline.

* * * * *